(12) United States Patent
Saitoh et al.

(10) Patent No.: US 6,838,772 B2
(45) Date of Patent: Jan. 4, 2005

(54) SEMICONDUCTOR DEVICE

(75) Inventors: Toshio Saitoh, Akiruno (JP); Kensuke Ishikawa, Ome (JP); Hiroshi Ashihara, Ome (JP); Tatsuyuki Saito, Ome (JP)

(73) Assignee: Renesas Technology Corp., Tokyo (JP)

( * ) Notice: Subject to any disclaimer, the term of this patent is extended or adjusted under 35 U.S.C. 154(b) by 40 days.

(21) Appl. No.: 10/437,900

(22) Filed: May 15, 2003

(65) Prior Publication Data

US 2003/0214043 A1 Nov. 20, 2003

(30) Foreign Application Priority Data

May 17, 2002 (JP) ...................................... 2002-142769

(51) Int. Cl.[7] .............................................. H01L 23/48
(52) U.S. Cl. ...................... 257/758; 257/750; 257/758; 257/759; 257/760; 438/618; 438/619; 438/620; 438/621; 438/622; 438/623; 438/624; 438/625; 438/626; 438/627
(58) Field of Search ................................ 257/750, 758, 257/759, 760; 438/618–627

(56) References Cited

U.S. PATENT DOCUMENTS 5,798,299 A * 8/1998 Chung ........................ 438/625

FOREIGN PATENT DOCUMENTS

| JP | 11-233631 | 8/1999 |
|----|-----------|--------|
| JP | 2000-040872 | 2/2000 |

* cited by examiner

*Primary Examiner*—David Nelms
*Assistant Examiner*—Mai-Huong Tran
(74) *Attorney, Agent, or Firm*—Antonelli, Terry, Stout & Kraus, LLP

(57) ABSTRACT

A semiconductor device has a first insulating film deposited over a semiconductor substrate, an interconnect opening portion formed in the first insulating film, an interconnect disposed in the interconnect opening portion, and a second insulating film formed over the first insulating film and the interconnect. The interconnect has a first conductor film, a second conductor film formed via the first conductor film and comprised of one of titanium silicon nitride, tantalum silicon nitride, tantalum nitride and titanium nitride, a third conductor film formed via the first and second conductor films and comprised of a material having good adhesion with copper; and a fourth conductor film formed via the first, second and third conductor film having a copper as a main component. Thus, it is possible to improve adhesion between a conductor film composed mainly of copper and another conductor film having a copper-diffusion barrier function in the interconnect.

21 Claims, 19 Drawing Sheets

- 11a – 11d: INSULATING FILM
- 15a – 15c: INSULATING FILM
- 16b: INTERCONNECT TRENCH (INTERCONNECT OPENING PORTION)
- 17b: CONDUCTIVE BARRIER FILM
- 17b1: CONDUCTOR FILM (FIRST CONDUCTOR FILM)
- 17b2: CONDUCTOR FILM (SECOND CONDUCTOR FILM)
- 17b3: CONDUCTOR FILM (THIRD CONDUCTOR FILM)
- 18b: MAIN CONDUCTOR FILM (FOURTH CONDUCTOR FILM)
- 18b1: CONDUCTOR FILM
- 18b2: CONDUCTOR FILM
- 19: THROUGH-HOLE (INTERCONNECT OPENING PORTION)

SEMICONDUCTOR DEVICE

BACKGROUND OF THE INVENTION

The present invention relates to a method of manufacture of a semiconductor device and a to semiconductor device; and, more particularly, the invention relates to a technique that is effective when applied to a method of manufacture of a semiconductor device and a to semiconductor device which use, as an interconnect material, a conductor film composed mainly of copper.

An inlaid interconnect structure is formed based on a metallization technique, called a damascene process, by embedding an interconnect material in an interconnect opening portion, such as an interconnect trench or hole, formed in an insulating film. When the main interconnect material is copper, however, it tends to be more easily diffused in an insulating film compared with another metal, such as aluminum. Thus, diffusion of copper from the inlaid interconnect into an insulating film has been suppressed or prevented by interposing a thin conductive barrier film between the interconnect forming conductor film composed mainly of copper and the insulating film.

A technique relating to a barrier metal film of a semiconductor device is described, for example, in Japanese Unexamined Patent Publication No. Hei 11(1999)-233631. This publication discloses a technique for forming a contact hole in an interlevel insulating film, and then forming a multilayer barrier metal film in the contact hole and over the interlevel insulating film by using PVD and CVD in combination. On the other hand, Japanese Unexamined Patent Publication No. 2000-40672 discloses a technique for forming a conductive barrier film by using tantalum (Ta) and tantalum nitride (TaN).

SUMMARY OF THE INVENTION

According to the technique investigated by the present inventors, a monolayer film of titanium silicon nitride (TiSiN), that is formed, for example, by metal organic chemical vapor deposition (MOCVD), is used as the above-described conductive barrier film for an inlaid interconnect, using copper as the above-described main interconnect material. This makes it possible to improve the covering property of the conductive barrier film in the hole which connects between two different layers, thereby improving the embedding property of the copper in the hole and suppressing or preventing a rise in the resistance in the hole. However, the present inventors have found, for the first time, by further investigation, that when the monolayer film of titanium silicon nitride is used as the conductive barrier film, conduction failure or electromigration in the hole, which connects between two different layers, occurs due to insufficient adhesion between the monolayer film and copper, so that such a conductive barrier film does not exhibit sufficient barrier function. Particularly, in a semiconductor device, a hole for connecting different layers tends to be miniaturized, so that the above-described problem in the hole becomes increasingly prominent.

An object of the present invention is to provide a technique that is capable of improving the adhesion between a conductor film composed mainly of copper and another conductor film having a copper-diffusion barrier property, each conductor film constituting an interconnect of a semiconductor device.

The above-described object, and other objects, and novel features of the present invention will become apparent from the description provided herein and the accompanying drawings.

Of the features of the invention disclosed in the present application, typical aspects will next be described briefly.

In one aspect of the present invention, between a conductor film composed mainly of copper and another conductor film formed by chemical vapor deposition and having a copper-diffusion barrier property, each conductor film being formed in an interconnect opening portion, a further conductor film made of a material having good adhesion with copper is formed.

In another aspect of the present invention, a conductor film, which has a copper-diffusion barrier property and is formed by chemical vapor deposition, is formed via another conductor film in an interconnect opening portion formed in an insulating film having a low-dielectric-constant insulating film, which has a lower dielectric constant than that of a silicon oxide film, and then a further conductor film composed mainly of copper is formed via these two conductor films.

In a further aspect of the present invention, the above-described conductor film, that is formed by chemical vapor deposition and has a copper-diffusion barrier property, is made of any one of titanium silicon nitride, tantalum silicon nitride, tantalum nitride and titanium nitride.

Representative examples of a semiconductor device in accordance with typical aspects of the present invention will be briefly described as follows.

(1) A method of manufacture of a semiconductor device, comprises the steps of:
 (a) depositing a first insulating film over a semiconductor substrate;
 (b) forming an interconnect opening portion in the first insulating film;
 (c) forming a first conductor film over the first insulating film and inside of the interconnect opening portion;
 (d) forming a second conductor film, that is made of any one of titanium silicon nitride, tantalum silicon nitride and titanium nitride, over the first conductor film by chemical vapor deposition or ALD;
 (e) forming, over the second conductor film, a third conductor film made of a material having good adhesion with copper;
 (f) forming a fourth conductor film composed of copper, or composed mainly of copper, over the third conductor film by embedding the interconnect opening portion with the fourth conductor film; and
 (g) removing the first, second, third and fourth conductor films, while leaving the first, second, third and fourth conductors films only in the interconnect opening portion, thereby forming an interconnect having the first, second, third and fourth conductor films in the interconnect opening portion.

(2) A method of manufacture of a semiconductor device, comprises the steps of:
 (a) depositing over a semiconductor substrate a first insulating film having a lower dielectric constant than that of silicon oxide;
 (b) forming an interconnect opening portion in the first insulating film;
 (c) forming a first conductor film over the first insulating film and inside of the interconnect opening portion;
 (d) forming a second conductor film, that is made of any one of titanium silicon nitride, tantalum silicon nitride, tantalum nitride and titanium nitride, over the first conductor film by chemical vapor deposition or ALD;

(e) forming a fourth conductor film composed of copper, or composed mainly of copper, over the second conductor film by embedding the interconnect opening portion with the fourth conductor film;

(f) removing the first, second and fourth conductor films, while leaving the first, second and fourth conductors films only in the interconnect opening portion, thereby forming an interconnect having the first, second and fourth conductor films in the interconnect opening portion; and (g) depositing a second insulating film over the first insulating film and the interconnect.

(3) A method of manufacture of a semiconductor device, comprises the steps of:

(a) depositing a first insulating film over a first interconnect formed over a semiconductor substrate;

(b) forming a second insulating film over the first insulating film;

(c) forming, in the first insulating film, a hole for connecting with the first interconnect and, in the second insulating film, an interconnect trench for connecting with the hole;

(d) forming a first conductor film on the side walls and bottom surface of each of the interconnect trench and the hole;

(e) forming a second conductor film, that is made of any one of titanium silicon nitride, tantalum silicon nitride, tantalum nitride and titanium nitride, over the first conductor film by chemical vapor deposition or ALD;

(f) forming, over the second conductor film, a third conductor film made of a material having good adhesion with copper; and (g) forming a fourth conductor film composed of copper or composed mainly of copper by embedding the interconnect trench and hole with the fourth conductor film.

(4) A method of manufacture of a semiconductor device, comprises the steps of:

(a) depositing, over a first interconnect formed over a semiconductor substrate, a first insulating film and a second insulating film, each having a dielectric constant lower than that of silicon oxide;

(b) forming, in the first insulating film, a hole for connecting with the first interconnect and, in the second insulating film, an interconnect trench for connecting with the hole;

(c) forming, over the sidewalls and bottom surface of each of the interconnect trench and hole, a first conductor film composed of a material having good adhesion with the first insulating film and the second insulating film;

(d) forming a second conductor film made of any one of titanium silicon nitride, tantalum silicon nitride, tantalum nitride and titanium nitride over the first conductor film by chemical vapor deposition or ALD; and (e) forming a fourth conductor film composed of copper, or composed mainly of copper, by embedding the interconnect trench and the hole with the fourth conductor film.

(5) A method of manufacture of a semiconductor device according to the item (1), wherein the third conductor film has a copper-diffusion barrier property.

(6) A method of manufacture of a semiconductor device according to the item (1), wherein the third conductor film is formed by physical vapor deposition.

(7) A method of manufacture of a semiconductor device according to the item (1), wherein the third conductor film is made of any one of tantalum, titanium, tantalum nitride, titanium nitride, a laminate film of tantalum and tantalum nitride and a laminate film of titanium and titanium nitride.

(8) A method of manufacture of a semiconductor device according to the item (1), wherein the first conductor film is made of a material having good adhesion with the first insulating film.

(9) A method of manufacture of a semiconductor device according to the item (1), wherein the first conductor film is made of a material having good adhesion with copper.

(10) A method of manufacture of a semiconductor device according to the item (1), wherein the first conductor film has a copper-diffusion barrier property.

(11) A method of manufacture of a semiconductor device according to the item (1), wherein the first conductor film is formed by physical vapor deposition.

(12) A method of manufacture of a semiconductor device according to the item (1), wherein the first conductor film is made of any one of tantalum, titanium, tantalum nitride, titanium nitride, a laminate film of tantalum and tantalum nitride and a laminate film of titanium and titanium nitride.

(13) A method of method of a semiconductor device according to the item (1), wherein the first insulating film is an insulating film having a lower dielectric constant than that of silicon oxide.

(14) A method of manufacture of a semiconductor device, comprises the steps of:

(a) depositing a first insulating film over a semiconductor substrate;

(b) forming an interconnect opening portion in the first insulating film;

(c) forming a second conductor film, that is made of any one of titanium silicon nitride, tantalum silicon nitride, tantalum nitride and titanium nitride, over the first conductor film and in the interconnect opening portion by chemical vapor deposition or ALD;

(d) forming a third conductor film made of a material having good adhesion with copper over the second conductor film;

(e) forming a fourth conductor film composed of copper, or composed mainly of copper, over the third conductor film by embedding the interconnect opening portion with the fourth conductor film;

(f) removing the second, third and fourth conductor films, while leaving the second, third and fourth conductor films only in the interconnect opening portion, thereby forming an interconnect having the second, third and fourth conductor films in the interconnect opening portion; and (g) depositing a second insulating film over the first insulating film and the interconnect.

(15) A method of manufacture of a semiconductor device, comprises the steps of:

(a) depositing a first insulating film over a first interconnect over a semiconductor substrate;

(b) forming a second insulating film over the first insulating film;

(c) forming, in the first insulating film, a hole for connecting with the first interconnect and, in the second insulating film, an interconnect trench for connecting with the hole;

(d) forming, over the side walls and bottom surface of each of the interconnect trench and hole, a second conductor film made of any one of titanium silicon nitride, tantalum silicon nitride, tantalum nitride and titanium nitride by chemical vapor deposition or ALD;

(e) forming, over the second conductor film, a third conductor film made of a material having good adhesion with copper; and (f) forming a fourth conductor film composed of copper, or composed mainly of copper, by embedding the interconnect opening portion and hole with the fourth conductor film.

(16) A method of manufacture of a semiconductor device according to the item (14), wherein the third conductor film has a copper-diffusion barrier property.

(17) A method of manufacture of a semiconductor device according to the item (14), wherein the third conductor film is formed by physical vapor deposition.

(18) A method of manufacture of a semiconductor device according to the item (14), wherein the third conductor film is made of any one of tantalum, titanium, tantalum nitride, titanium nitride, a laminate film of tantalum and tantalum nitride and a laminate film of titanium and titanium nitride.

DETAILED DESCRIPTION OF THE PREFERRED EMBODIMENTS

Figure 1:
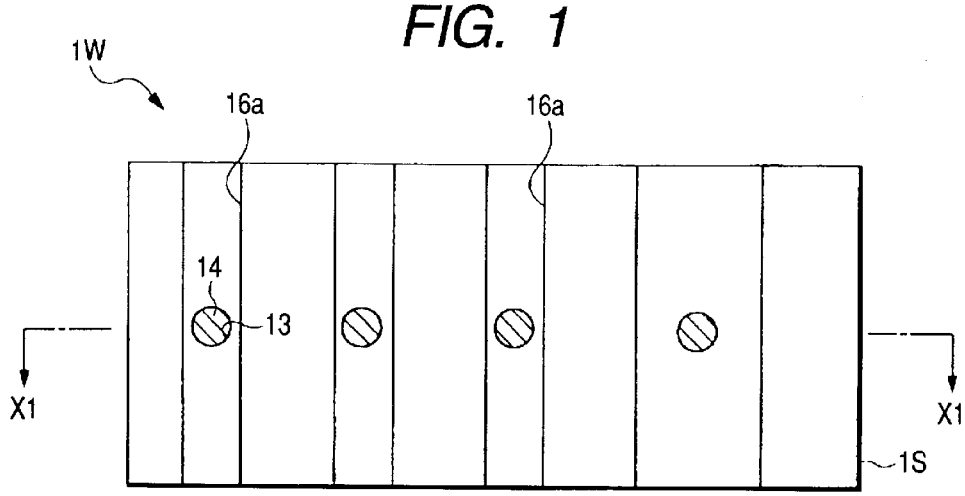
FIG. 1 is a fragmentary plan view of a semiconductor device, as seen in a manufacturing step thereof, according to one embodiment of the present invention.

Prior to a detailed description of the embodiments of the present invention, the meanings of the terms used to describe the embodiments herein will be explained.

1. The term "wafer" means a silicon or other semiconductor single crystal substrate (generally in the form of a substantially disc shaped, semiconductor wafer) used for the fabrication of a semiconductor integrated circuit device, a sapphire substrate, glass substrate or other insulating, non-insulating or semiconductor substrate, or a composite substrate thereof.

2. The term "semiconductor device" means not only a device formed over a single crystal silicon substrate, but also that formed over another substrate, such as an SOI (Silicon On Insulator) substrate or TFT (Thin Film Transistor) liquid-crystal fabricating substrate, unless otherwise specifically indicated 3. The term "inlaid interconnect" or "inlaid metal interconnect" usually means an interconnect formed by embedding a conductive film inside of an interconnect opening portion, such as trench or hole, formed in an insulating film and removing an unnecessary portion of the conductive film over the insulating film by a metallization technique, thereby patterning the film, as in single damascene or dual damascene processing. The term "single damascene" usually means an inlaid interconnect forming process wherein a plug metal and an interconnect metal are embedded in two stages. The term "dual damascene" usually means an inlaid interconnect forming process wherein a plug metal and an interconnect metal are embedded simultaneously. It is a common practice to use a copper inlaid interconnect as a multi-level constitution.

4. In this disclosure, for example, the expression "is composed of copper" means "has copper as a main component". Even high-purity copper inevitably contains impurities, so that a member composed of copper is not prohibited from containing additives or impurities. This will equally apply to materials other than copper (such as titanium, tantalum, titanium nitride, tantalum nitride, titanium silicon nitride, and tantalum silicon nitride).

5. The term "conductive barrier film" usually means a conductive film having a diffusion barrier property formed so as to be comparatively thin on the side surfaces or bottom surface of an inlaid interconnect in order to prevent copper from diffusing into an interlevel insulating film or underlying layer.

6. The term "chemical mechanical polishing (CMP)" usually means polishing of a surface by relatively moving it in a direction of the surface, while supplying a slurry under a state wherein it is brought into contact with a polishing pad formed of a relatively soft sheet material, such as a cloth. In this disclosure, this term also embraces CML (Chemical Mechanical Lapping) for polishing the surface by moving it relative to the surface of a hard grindstone, polishing with another fixed abrasive, and abrasive-free CMP, wherein polishing is conducted without using an abrasive.

7. The term "abrasive-free chemical mechanical polishing" usually means chemical mechanical polishing using a slurry having an abrasive weight concentration less than 0.5 wt. %, while the term "abrasive-using chemical mechanical polishing" means chemical mechanical polishing using a slurry having an abrasive weight concentration of 0.5 wt. % or greater. However, these definitions are relative. When abrasive-free chemical mechanical polishing is employed as a first step of polishing, followed by abrasive-using chemical mechanical polishing as a second step of polishing, and the polishing concentration of the first step is smaller by at least a single digit, and desirably at least double digits than that of the second step, polishing of this first step may be called "abrasive-free chemical mechanical polishing". The term "abrasive-free chemical mechanical polishing" as used herein embraces, also a case wherein the whole unit planarization process of a metal film is conducted by abrasive-free chemical mechanical polishing, a case wherein abrasive-free chemical mechanical polishing is applied to a main process, but abrasive-using chemical mechanical polishing is applied to a secondary process.

8. The term "scratch free" means a state where no defects greater than a predetermined size can be detected over the whole area or a predetermined unit area of the surface of a wafer polished by the above-described CMP. This predetermined size varies, depending on the generation or kind of a semiconductor device. It cannot be determined in a wholesale manner, but in this disclosure, for example, defects of 0.3 $\mu$m or greater are not detected within the polished surface of a wafer having a diameter of 200 mm as a result of an in-line comparative defect detection.

9. The term "silicon nitride" or "silicon nitride film" means not only $Si_3N_4$, but also a nitride of silicon having a similar composition thereto.

10. The term "low-dielectric-constant insulating film (Low-K insulating film)" means an insulating film having a lower dielectric constant than that of a silicon oxide film (e.g. TEOS (tetraethoxysilane) oxide film) included in a passivation film. Usually, it means a film having a specific dielectric constant $\epsilon$ lower than that of a TEOS oxide film, that is, about 4.1 or 4.2.

11. The term "plasma treatment" means a treatment involving exposing the surface of a substrate to an environment under a plasma state, or, if a member such as an insulating film or a metal film is formed over the substrate, exposing the surface of the member to such an environment, thereby subjecting the surface to the chemical and mechanical (bombardment) actions of the plasma. Plasma is usually generated, while filling a reaction chamber purged with a specific gas (treatment gas) with the treatment gas as needed, by ionizing the gas by the action of a high frequency field. However, it is impossible to completely purge the chamber with the treatment gas. In this disclosure, therefore, the term "ammonia plasma" does not mean a complete ammonia plasma, but it may contain impurity gases (such as nitrogen, oxygen, carbon dioxide and vapor). Similarly, it is needless to say that the plasma may contain another dilution gas or additive gas.

12. The term "plasma of a reducing atmosphere" means a plasma environment in which reactive species, such as radicals, ions, atoms and molecules, which have a reducing action, that is, an oxygen withdrawing action, exist dominantly. These radicals or ions include atomic or molecular radicals or ions. Moreover, the environment may contain not only a single reactive species, but plural reactive species. For example, the environment may have therein hydrogen radicals and $NH_3$ radicals simultaneously.

In the below-described embodiments, the description may be made with the subject matter divided in plural sections or in plural embodiments, if necessary for convenience's sake. These plural sections or embodiments are not independent of each other, but are in a relation such that one is a modification, example, a detailed or complementary description of a part or whole of the other one, unless otherwise specifically indicated. In the below-described embodiments, when a reference is made to a number of elements (including a number, value, amount and range), the number of elements is not limited to a specific number, but can be greater than or less than the specific number, unless otherwise specifically indicated, or in the case it is principally apparent that the number is limited to the specific number. Moreover in the below-described embodiments, it is needless to say that the constituting elements (including element steps) are not always essential, unless otherwise specifically indicated, or in the case where it is principally apparent that they are essential. Similarly, in the below-described embodiments, when a reference is made to the shape or positional relationship of the constituting elements, a shape or positional relationship substantially analogous or similar to it is also embraced, unless otherwise specifically indicated, or in the case where it is utterly different in principle. This also applies to the above-described value and range.

In all of the drawings for describing the embodiments, elements having a like function will be identified by like reference numerals and overlapping descriptions thereof will be omitted. In the drawings, even a plan view is sometimes hatched to facilitate understanding of the drawing. In the below-described embodiments, MIS•FET (Metal Insulator Semiconductor Field Effect Transistor), which is a typical field effect transistors, will be abbreviated as MIS. A p-channel type MIS•FET and an n-channel type MIS•FET will be abbreviated as pMIS and nMIS, respectively. Incidentally, MOS•FET (Metal Oxide Semiconductor Field Effect Transistor) is a narrow term of MIS.

The embodiments of the present invention will hereinafter be described specifically based on the accompanying drawings.

(Embodiment 1)

Figure 25:
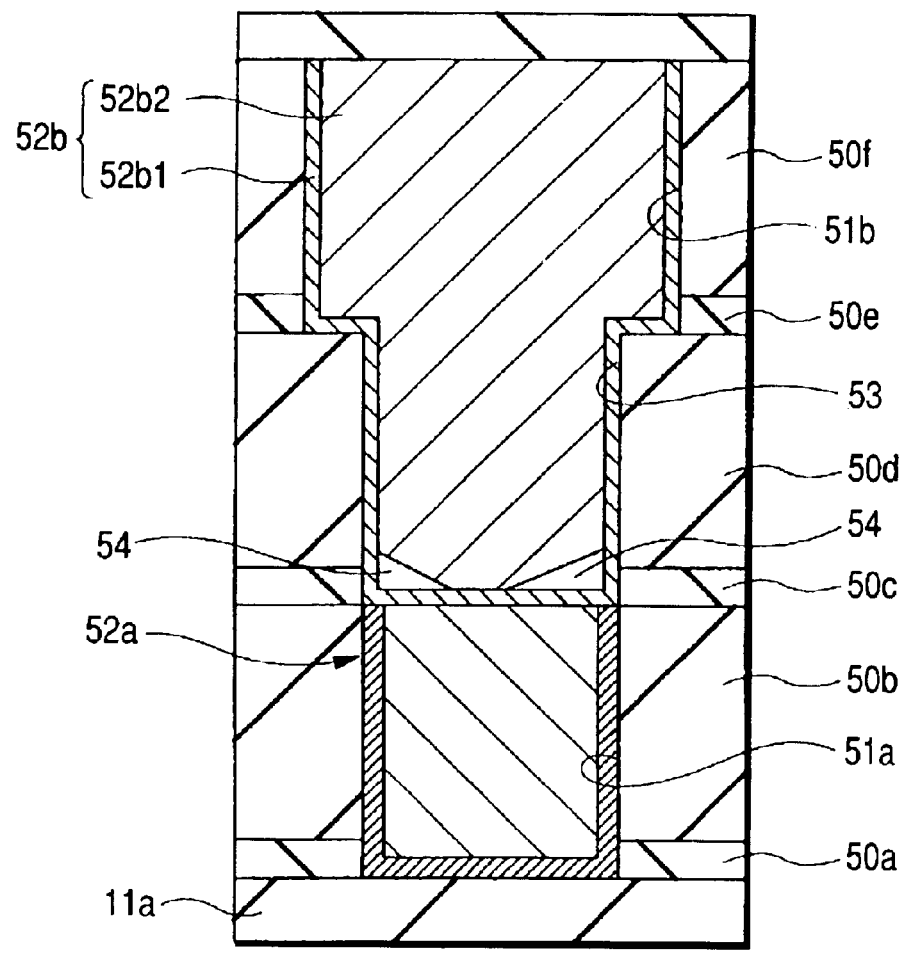
FIG. 25 is a cross-sectional view illustrating the problem of the inlaid interconnect structure investigated by the present inventors.

First, the problem investigated by the present inventors will be described. FIG. 25 is a cross-sectional view of an inlaid interconnect structure that has been investigated by the present inventors. In the insulating films 50a,50b, an interconnect trench 51a is formed. Inside of the interconnect trench 51a, an inlaid first-level interconnect 52a is formed. In the insulating films 50c,50d,50e,50f formed thereover, an interconnect trench 51b and a through-hole 53 are formed. In the interconnect trench 51b and through-hole 53, an inlaid second-level interconnect 52b is formed. The inlaid second-level interconnect 52b has a conductive barrier film 52b1 and a main conductive film 52b2 that is composed mainly of copper (Cu). The conductive barrier film 52b1 is made of, for example, titanium silicon nitride (TiSiN) formed by MOCVD. This conductive barrier film 52b1 can be formed by sputtering, but, when sputtering, for example, in the case where the through-hole 53 has an aspect ratio of 4, the coverage of the side walls of the through-hole 53 is as low as about 10% of the thickness of the conductive barrier film deposited over the insulating film 50f. In order to ensure a copper-diffusion barrier property in the through-hole 53, it therefore becomes necessary to thicken the conductive barrier film (about 30 to 50 nm) to be deposited over the insulating film 50f. As miniaturization of the diameter (about 0.18 µm or less) of the through-hole 53 advances in the future, various problems, such as a rise in resistance at the interconnect and through-hole portions and the occurrence of embedding failure owing to pinch-off upon deposition of the main conductor film 52b2 caused by overhanging of the conductive barrier film at the upper portion of the opening of the through-hole 53, will arise. When the conductive barrier film 52b1 is formed by chemical vapor deposition (CVD), on the other hand, the conductive barrier film does not overhang at the upper portion of the opening of the through-hole 53, compared with the above-described sputtering method, making it possible to improve the coverage, thereby improving the embedding property of copper in the through-hole 53. This makes it possible to suppress or prevent a rise in resistance at the through-hole 53 portion. According to investigation, the present inventors have found, for the first time, that when a monolayer film of titanium silicon nitride is used, it does not exhibit a sufficient function as the conductive barrier film 52b1, because, owing to insufficient adhesion with copper (adhesion insufficient portion 54 of FIG. 25), conduction failure or electromigration occurs at the through-hole 53. Particularly, in a semiconductor device, a hole for connecting different layers, such as a contact hole or a through-hole, tends to be miniaturized, and so the above-described problem becomes increasingly prominent. In this Embodiment 1, between a conductor film composed mainly of copper and a conductive barrier film, such as titanium silicon nitride formed by CVD, another conductor film having a function of improving their adhesion is disposed.

Figure 2:
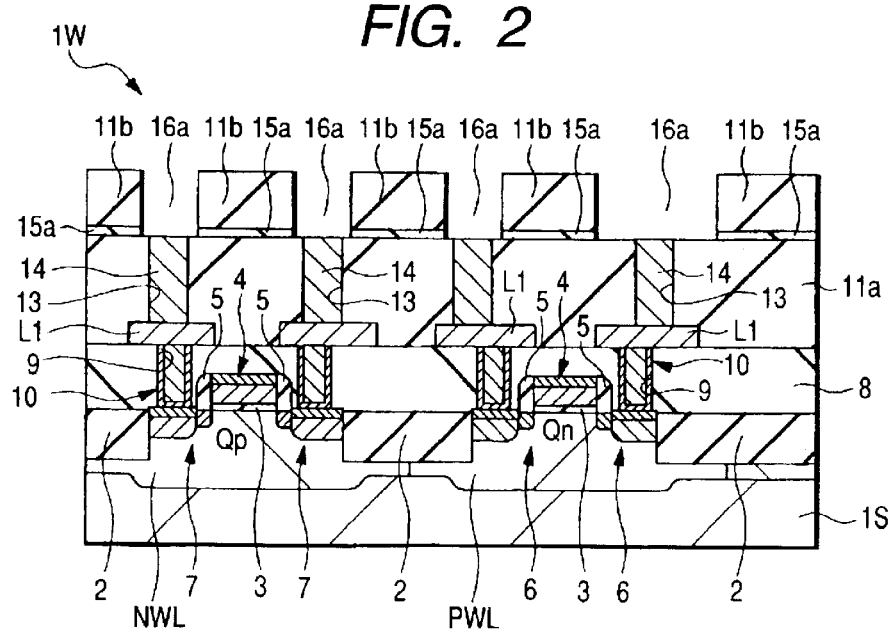
FIG. 2 is a cross-sectional view taken along a line X1—X1 of FIG. 1.

Next, one specific example of the method of manufacture of the semiconductor device according to Embodiment 1 will be described with reference to FIGS. 1 to 16. FIG. 1 is a fragmentary plan view of the semiconductor device of Embodiment 1, as seen during its manufacture; and FIG. 2 is a cross-sectional view taken along a line X1—X1 of FIG. 1. A semiconductor substrate (which will hereinafter simply be called a "substrate") constituting a wafer 1W is made of, for example, p type single crystal silicon having a specific resistance of about 1 to 10 Ωcm. The substrate 1S has, on the main surface (device formation surface) thereof, a groove isolation (SGI (Shallow Groove Isolation) or STI (Shallow Trench Isolation)) 2. This groove isolation 2 is formed by embedding a groove formed in the main surface of the substrate 1S with a silicon oxide film, for example, by CVD. On the main surface side of the substrate 1S, a p type well PWL and an n type well NWL are formed. In the p type well PWL and n type well NWL, for example, boron and phosphorus are introduced, respectively. In the p type well PWL and n type well NWL, which are active regions surrounded by this groove isolation 2, a nMISQn and a pMISQp constituting a CMIS (Complementary MIS) circuit are formed.

A gate insulating film 3 of each of the nMISQn and pMISQp is made of, for example, a silicon oxide film of about 6 nm thick. The thickness of the gate insulating film 3 is a film thickness in terms of silicon dioxide (which will hereinafter be called "reduced film thickness") and does not always coincide with the actual film thickness. The gate insulating film 3 may be formed of a silicon oxynitride film instead of a silicon oxide film. In other words, the gate insulating film 3 may be structured to cause segregation of nitrogen on the interface between the gate insulating film 3 and the substrate 1S. Since the silicon oxynitride film is more effective for suppressing generation of an interface state in the film or reducing electron traps than a silicon oxide film, it is capable of improving the hot carrier resistance of the gate insulating film 3, thereby improving its dielectric strength. Moreover, the silicon oxynitride film does not permit easier penetration of impurities therethrough compared with a silicon oxide film, so that when it is used, fluctuations of a threshold voltage due to diffusion of impurities of the gate electrode material toward the side of the substrate 1S can be suppressed. The silicon oxynitride film is formed, for example, by forming the gate insulating film 3 made of silicon oxide over the surface of each of the p type well PWL and n type well NWL by the oxidation method, followed by heat treatment of the wafer 1W in an atmosphere of a nitrogen-containing gas, such as NO, $NO_2$ or $NH_3$.

Alternatively, the gate insulating film 3 may be formed of, for example, a silicon nitride film or a composite insulating film of a silicon oxide film and a silicon nitride film. When the reduced film thickness of the gate insulating film 3 made of a silicon oxide film is decreased to less than 5 nm, particularly less than 3 nm, generation of a direct tunnel current and a reduction in the dielectric breakdown due to hot carriers resulting from stress become apparent. The dielectric constant of a silicon nitride film is higher than that of a silicon oxide film so that the reduced film thickness of the silicon nitride film becomes thinner than the actual film thickness. In other words, when the gate insulating film has a silicon nitride film, even if it is physically thick, the capacitance of it is equal to that of a relatively thin silicon dioxide film. By constituting the gate insulating film 3 from a single silicon nitride film or a composite film thereof with a silicon oxide film, the effective film thickness can be made thicker than the gate insulating film constituted of a silicon oxide film, making it possible to suppress generation of a tunnel leakage current or a lowering of the dielectric breakdown by hot carriers.

The gate electrode 4 of the nMISQn and pMISQp is formed, for example, by stacking over a low resistance polycrystalline silicon film, a titanium silicide (TiSi$_x$) layer or cobalt silicide (CoSi$_x$) layer. However, the gate electrode structure is not limited to the above-described one, but may be a so-called polymetal gate structure having, for example, a low resistance polycrystalline silicon film, a WN (tungsten nitride) film and a W (tungsten) film stacked one after another. On the side surfaces of the gate electrode 4, side walls 5 made of, for example, silicon oxide are formed.

A semiconductor region 6 for the source and drain of the nMISQn has an n$^-$ semiconductor region adjacent to a channel and an n$^+$ semiconductor region, which is connected to the n$^-$ semiconductor region and is disposed at a position spaced apart from the channel by the width of the n$^-$ semiconductor region. Into the n$^-$ semiconductor region and n$^+$ semiconductor region, for example, phosphorus or arsenic has been introduced. On the other hand, a semiconductor region 7 for the source and drain of the pMISQp has a p$^-$ semiconductor region adjacent to a channel and a p$^+$ semiconductor region which is connected to the p$^-$ semiconductor region, and is disposed at a position spaced apart from the channel by the width of the p$^-$ semiconductor region. Into the p$^-$ semiconductor region and p$^+$ semiconductor region, for example, boron has been introduced. A silicide layer, such as a titanium silicide layer or cobalt silicide layer, is formed partially over these semiconductor regions 6,7.

An insulating film 8 is deposited over the main surface of the substrate 1S of the wafer 1W. This insulating film 8 is made of a film having a reflow property that is high enough to fill a narrow space between the gate electrodes 4,4, for example, a BPSG (Boron-doped Phospho Silicate Glass) film. The insulating film 8 may be formed of an SOG (Spin On Glass) film by spin coating. The insulating film 8 has a contact hole 9 formed therein From the bottom of the contact hole 9, the upper surface of the semiconductor regions 6,7 are partially exposed. In the contact hole, a plug 10 is formed. This plug 10 is formed, for example, by depositing by CVD, a titanium nitride (TiN) film and a tungsten (W) film over the insulating film 8, including the inside of the contact hole 9, and then, removing unnecessary portions of the titanium nitride film and tungsten film from the insulating film 8 by CMP or etch back to leave these films only inside of the contact hole 9.

A first-level interconnect L1 made of, for example, tungsten is formed over the insulating film 8. This first-level interconnect L1 is electrically connected to the gate electrode 4 and semiconductor regions 6,7 for the source-drain of the nMISQn or pMISQp through the plug 10. Not only tungsten, but also various materials, are usable as the material of the first-level interconnect L1. For example, a single metal film of aluminum (Al), or aluminum alloy or a laminated metal film obtained by stacking a metal film, such as titanium (Ti) or titanium nitride (TiN), over at least one of the layers on both sides of such a single metal film, may be used. Over the insulating film 8, an insulating film 11a that is made of, for example, silicon oxide is deposited to cover the first-level interconnect L1. A through-hole 13 for exposing a part of the first-level interconnect L1 is formed in the insulating film 11a. In the through-hole 13, a plug 14 made of, for example, tungsten is embedded.

Over the insulating film 11a and plug 14, an insulating film 15a is deposited by plasma CVD. The insulating film 15a is made of, for example, silicon nitride, and it has a thickness of about 25 nm to 50 nm, preferably, about 50 nm. When the insulating film 15a is made of a silicon nitride film, it is formed by plasma CVD using a monosilane (SiH$_4$) gas and a mixed gas of ammonia (NH$_3$) and nitrogen gas (N$_2$). The insulating film 15a may be made of a Low-K material, such as silicon carbonitride (SiCN), silicon carbide (SiC) or silicon oxynitride (SiON). The insulating film 15a made of silicon carbonitride is formed, for example, by plasma CVD using a mixed gas of trimethylsilane (3MS; Si(CH$_3$)$_3$H), ammonia (NH$_3$) and a carrier gas (helium (He) or nitrogen (N$_2$)). The insulating film 15a made of silicon carbide is formed, for example, by plasma CVD using a mixed gas of trimethylsilane and carrier gas (helium). The insulating film 15a made of silicon oxynitride is formed, for example, by plasma CVD using a mixed gas of trimethylsilane (TMS; SiH(OCH$_3$)$_3$) and nitrogen oxide (N$_2$O). Examples of the silicon oxynitride include PE-TMS (trade name; product of Canon, dielectric constant: 3.9). A drastic reduction in the dielectric constant can be attained by the formation of the insulating film 15a from silicon carbonitride, silicon carbide or silicon oxynitride, as compared with the formation of it from silicon nitride. This makes it possible to lower the interconnect capacitance, thereby improving the operation speed of the resulting semiconductor device. Over this insulating film 15a, an insulating film 11b is deposited. The insulating film 11b is made of the same material as that of the insulating film 11a and it is deposited to be thicker than the insulating film 15a.

By photolithography and dry etching, the insulating films 11b,15a are selectively removed to form an interconnect trench (interconnect opening portion) 16a. When the interconnect trench 16a is formed, an etching selectivity of the insulating film 11b relative to the insulating film 15a is set to be large, whereby the insulating film 15a is caused to function as an etching stopper. In other words, after etching is terminated once on the surface of the insulating film 15a, the insulating film 15a is selectively removed by etching. This makes it possible to improve the depth precision of the interconnect trench 16a and prevent overetching of the interconnect trench 16a. In FIG. 1, the interconnect trench 16a having a strip shaped plane and extending in the perpendicular direction is illustrated. From the bottom of the interconnect trench 16a, the upper surface of the plug 14 is exposed. This interconnect trench 16a has an aspect ratio of, for example, 1.

Figure 3:
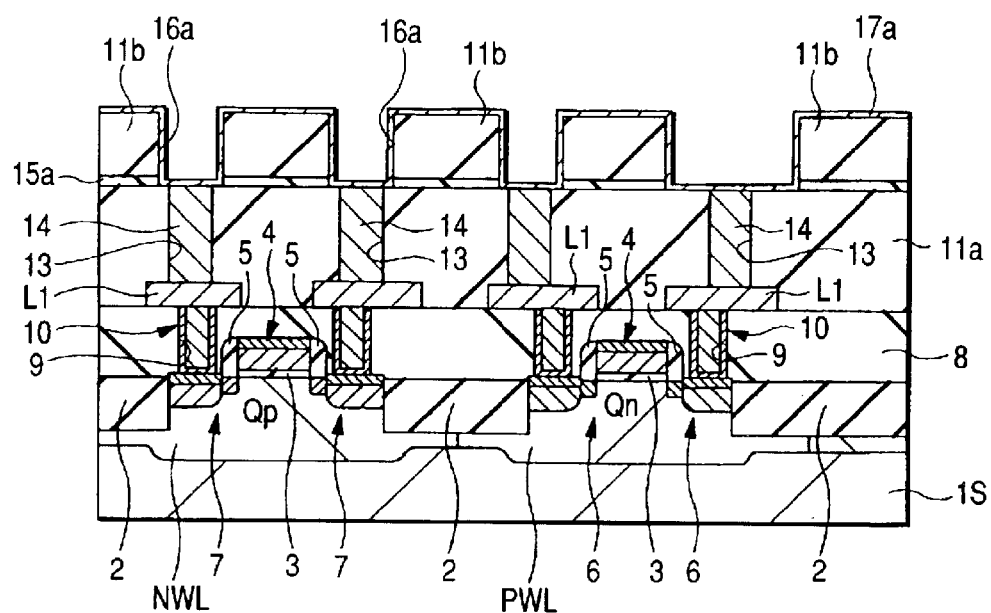
FIG. 3 is a cross-sectional view of a portion of the semiconductor device corresponding to the line X1—X1 of FIG. 1, as seen in a manufacturing step following that of FIG. 1.
Figure 4:
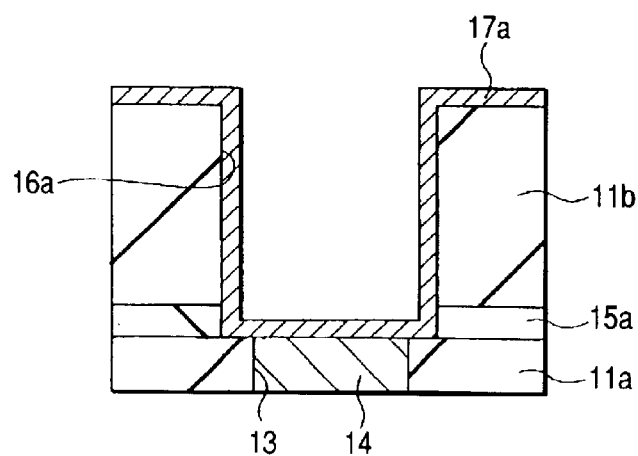
FIG. 4 is a fragmentary enlarged cross-sectional view of an interconnect trench portion of FIG. 3.

FIG. 3 is a cross-sectional view of a portion of the semiconductor device, as seen in a manufacturing step following that of FIG. 1, which portion corresponds to a line X1—X1 of FIG. 1; and FIG. 4 is a fragmentary enlarged cross-sectional view of a portion of the interconnect trench 16a of FIG. 3. As illustrated in FIGS. 3 and 4, a thin conductive barrier film 17a, made of a refractory metal, such as tantalum (Ta), is deposited all over the main surface of the wafer 1W by sputtering or MOCVD (Metal Organic Chemical Vapor Deposition). This conductive barrier film 17a has, for example, functions of preventing diffusion of copper for the formation of a main conductor film, which will be described later, improving the adhesion between the main conductor film and insulating films 11b,15a and improving wetness of copper upon reflow of the main conductor film. As the conductive barrier film 17a, tantalum (Ta), which has poor reactivity with copper but has high adhesion therewith, is used. The conductive barrier film 17a is deposited over the insulating film 11b with a thickness of, for example, about 50 nm. Instead of tantalum, a refractory metal, such as titanium (Ti), tungsten (W) or a titanium tungsten (TiW) alloy, or a nitride of a high refractory metal which hardly reacts with copper, such as tantalum nitride (TaN), tungsten nitride (WN) or titanium nitride (TiN), may be employed. Instead of a monolayer tantalum film, a laminate film obtained by stacking tantalum nitride and tantalum in this order from the side of the substrate 1S may be employed. Alternatively, a material obtained by adding silicon (Si) to a nitride of a refractory metal, such as titanium silicon nitride (TiSiN), may be employed.

Figure 5:
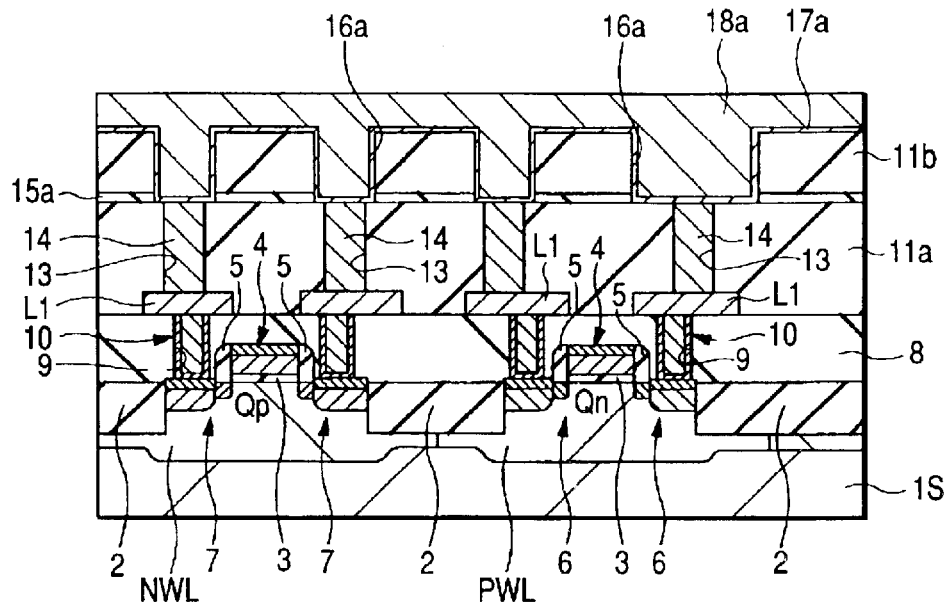
FIG. 5 is a cross-sectional view of a portion of the semiconductor device corresponding to the line X1—X1 of FIG. 1, as seen in a manufacturing step following that of FIG. 3.
Figure 6:
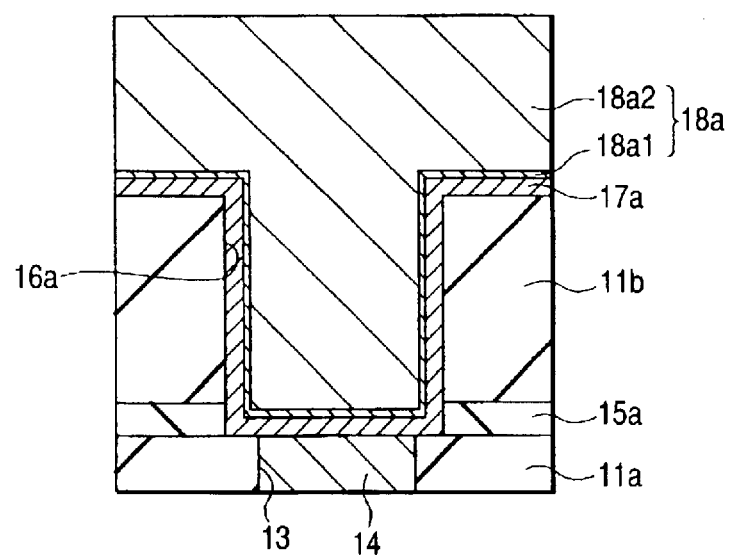
FIG. 6 is a fragmentary enlarged cross-sectional view of the interconnect trench portion of FIG. 5.

FIG. 5 is a cross-sectional view of a portion of the semiconductor device, as seen in a manufacturing step following that of FIG. 3, which portion corresponds to a line X1 —X1 of FIG. 1; and FIG. 6 is a fragmentary enlarged cross-sectional view of a portion of the interconnect trench 16a of FIG. 5. As illustrated in FIGS. 5 and 6, a main conductor film 18a, that is made of a relatively thick copper film of about 800 to 1600 nm thick, is deposited over the conductive barrier film 17a. In this Embodiment 1, the main conductor film 18a is made, for example, by the plating method. By adopting the plating method, the main conductor film 18a, having a good film quality, can be embedded well at a low cost. In this case, the main conductor film 18a is formed by depositing a thin conductor film 18a1 made of copper over the conductive barrier film 17a by sputtering, and, then, causing a relatively thick conductor film 18a2 made of copper to grow over the conductor film 18a1, for example, by electroplating or an electroless plating method. For this plating treatment, a plating solution composed principally of copper sulfate is used. Alternatively, the above-described main conductor film 18a may be formed by sputtering. Although an ordinarily employed sputtering method is usable as the sputtering method for forming the conductive barrier film 17a and main conductor film 18a, use of a sputtering method having high directivity, such as long throw sputtering, or collimate sputtering is preferred in order to improve the embedding property and film quality. The main conductor film 18a may be formed by CVD instead. After deposition of such a main conductor film 18a, the substrate 1S is subjected to heat treatment, for example, in a nonoxidizing-atmosphere (for example, a hydrogen atmosphere) of about 475° C. to cause reflow of the main conductor film 18a, whereby copper is completely embedded in the interconnect trench 16a.

Figure 7:
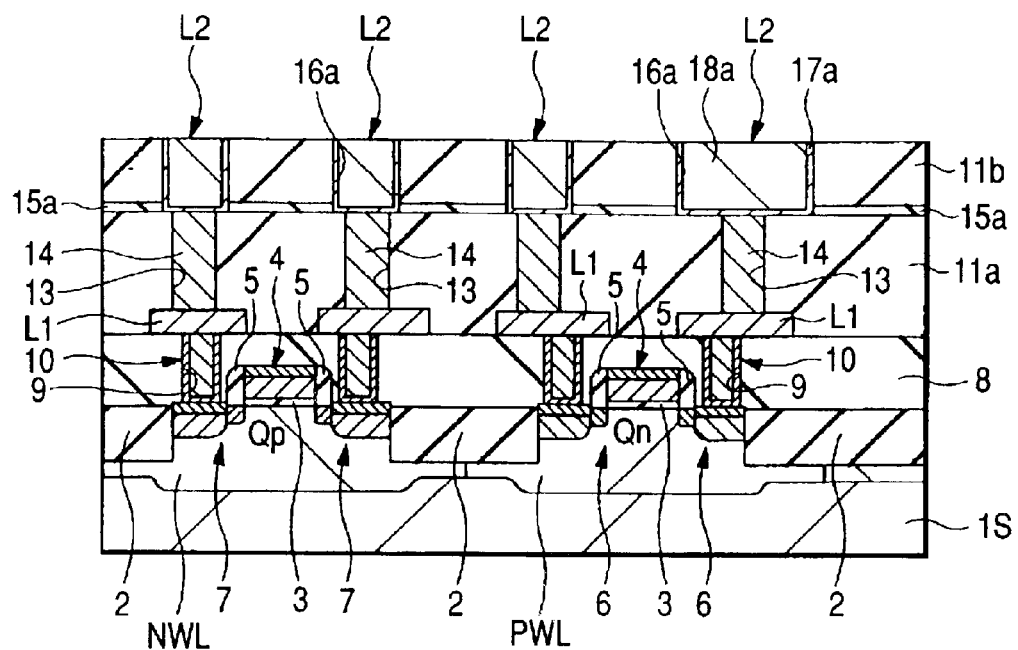
FIG. 7 is a cross-sectional view of a portion of the semiconductor device corresponding to the line X1—X1 of FIG. 1 in a manufacturing step following that of FIG. 5.
Figure 8:
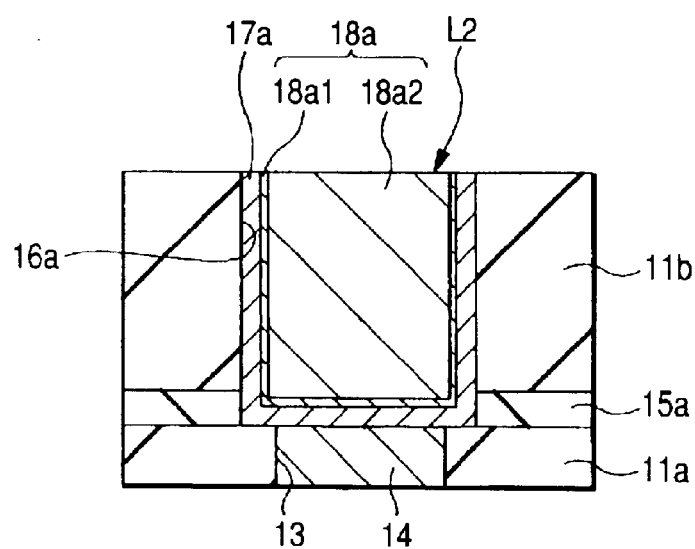
FIG. 8 is a fragmentary enlarged cross-sectional view of the interconnect trench portion of FIG. 7.

FIG. 7 is a cross-sectional view of a portion of the semiconductor device, as seen in a manufacturing step following that of FIG. 5, which portion corresponds to a line X1—X1 of FIG. 1; and FIG. 8 is a fragmentary enlarged cross-sectional view of a portion of the interconnect trench 16a of FIG. 7. In this step, the main conductor film 18a and conductive barrier film 17a, as illustrated in FIG. 5, are polished by CMP to form an inlaid second-level interconnect L2 in the interconnect trench 16a. The inlaid second-level interconnect L2 has a relatively thin conductive barrier film 17a and a relatively thick main conductor film 18a, and it is electrically connected to the first-level interconnect L1 via the plug 14.

In this Embodiment 1, the CMP which is employed is a two-step CMP having, for example, the above-described abrasive-free CMP (first step) and abrasive-using CMP (second step), which will next be described specifically.

The first-step CMP aims at selectively polishing the main conductor film 18a made of copper. The polishing solution (slurry) contains an anticorrosive for the formation of a protective film, an oxidizing agent of copper and an etching component of the oxidized film of copper, but does not contain an abrasive. The polishing solution contains an abrasive, for example, in an amount of 0.5 wt. % or less, preferably 0.1 wt. % or less, particularly preferably 0.05 wt. % or less, still more preferably 0.01 wt. % or less. The abrasive may be added in an amount of about 3 to 4% of the whole amount of the polishing solution. A polishing solution having its pH adjusted to fall within a corrosion region of copper is employed. Moreover, a polishing solution having a composition whose polishing selectivity of the main conductor film 18a relative to the conductive barrier film 17a is adjusted to fall within a range of 5 or greater is employed. As such a polishing solution, a slurry containing an oxidizing agent and an organic acid can be given as an example. Examples of the oxidizing agent include hydrogen peroxide ($H_2O_2$), ammonium hydroxide, ammonium nitrate and ammonium chloride, while those of the organic acid include citric acid, malonic acid, fumaric acid, malic acid, adipic acid, benzoic acid, phthalic acid, tartaric acid, lactic acid, succinic acid and oxalic acid. Of these, hydrogen peroxide is an oxidizing agent suitably added to a polishing solution, because it does not contain a metal component and, at the same time, is not a strong acid, while citric acid is an organic acid suitably added to a polishing solution, because it is usually employed as a food additive, has low toxicity, is not so harmful as a waste liquid, is free of odor and has a high water solubility. In this Embodiment, a polishing solution obtained by adding 5 vol. % of hydrogen peroxide and 0.03 wt. % of citric acid to pure water and having an abrasive content adjusted to 0.01 wt. % or less is employed. As the anticorrosive, BTA is, for example, employed.

In this first-step abrasive-free CMP, the main conductor film 18a is polished principally by a chemical factor, while producing both the protecting action and etching action of the main conductor film 18a. More specifically, by chemical mechanical polishing with the above-described polishing solution, the copper surface is oxidized by the oxidizing agent, whereby a thin oxidized layer is formed on the surface. When a water solubilizing substance of the oxide is then fed to the oxidized layer, it elutes as a water solution and the thickness of the oxidized layer decreases. A thinned portion of the oxidized layer becomes thick by exposure to an oxidizing substance. By the repetition of this reaction, chemical mechanical polishing proceeds. The protective film is removed mainly by contact with a polishing pad.

The polishing is conducted under the following conditions, as one example, of a load of 250 g/cm$^2$, a wafer-carrier rotation speed of 30 rpm, a platen rotation speed of 25 rpm and a slurry flow rate of 150 cc/min. As the polishing pad, a hard pad ("IC1400", trade name; product of Rodel/USA) is employed. A hard pad is employed here for increasing the flatness of the film, but a soft pad also may be usable instead. Polishing is terminated when the main conductor film 18a is removed to expose the underlying conductive barrier film 17a. The terminal point is detected by detecting at change in rotation torque signal intensity of a platen or wafer carrier when a shift of a subject to be polished from the main conductor film 18a to the conductive barrier film 17a occurs. Alternatively, it is possible to make a hole through a part of the polishing pad and detect a terminal point based on a change in the reflection spectrum of a light from the surface of the wafer 1W, or to detect a terminal point based on a change in the optical spectrum of a slurry. In such a polishing treatment, the polishing rate of the main conductor film 18a made of copper is, for example, about 500 nm/min, while that of the conductive barrier film 18a is, for example, about 3 nm/min. Although the polishing time cannot be determined in a wholesale manner, because it differs with the thickness of the main conductor film 18a, polishing is conducted, for example, for about 2 to 4 minutes when the film thickness is as described above.

The second step subsequent to the first step aims at selectively polishing the conductive barrier film 17a. In this second step, the conductive barrier film 17a is polished mainly by a mechanical factor, while bringing it into contact with a polishing pad. The polishing solution used here contains an abrasive, in addition to the anticorrosive, oxidizing agent and etching component of the oxidized film. In this Embodiment 1, a mixture obtained by adding, for example, 5 vol. % of hydrogen peroxide, 0.03 wt. % of citric acid and 0.5 to 0.8 wt. % of an abrasive to pure water is used as the polishing solution. The polishing solution is not limited thereto. The amount of the abrasive is set so that the underlying insulating film 11b is not etched by it, for example, 1 wt. % or less. As the abrasive, colloidal silica ($SiO_2$) is, for example, employed. Use of colloidal silica as the abrasive contributes to a drastic reduction in the damage on the surface of the insulating film 11b that is polished by CMP, whereby a scratch free polishing can be realized. In this second step, the amount of the oxidizing agent is smaller than that used in the first step, which results in a relative increase in the amount of the anticorrosive in the polishing solution. Polishing is conducted at a polishing selectivity of the main conductor film 18a relative to the conductive barrier film 17a lower than that upon the abrasive-free chemical mechanical polishing, for example, 3 or less. By polishing under such a condition in the second step, protection can be reinforced while suppressing oxidation of the main conductor film 18a made of copper, whereby excessive polishing of the main conductor film 18a can be prevented and dishing or erosion can be suppressed or prevented. This makes it possible to suppress or prevent an increase or fluctuations in an interconnect resistance, thereby improving the performance of the resulting semiconductor device.

The polishing carried out in the second step is conducted under the conditions, as one example, of a load of 120 g/cm$^2$, a wafer carrier rotation speed of 30 rpm, a platen rotation speed of 25 rpm and a slurry flow rate of 150 cc/min. As the polishing pad, "IC1400" (trade name; product of Rodel) is employed. The polishing amount is set to correspond to the thickness of the conductive barrier film 17a and the terminal point of the polishing is controlled by the polishing time calculated from the thickness of the conductive barrier film 17a and the polishing speed. In such polishing treatment, the polishing rates of the conductive barrier film 17a, the main conductor film 18a made of copper and the underlying insulating film 12b are, for example, about 80 nm/min, about 7 nm/min and about 3 nm/min, respectively. Although the polishing time cannot be determined in a wholesale manner because it differs, depending on the thickness of the conductive barrier film 17a, it is about one minute when the film has the above-described thickness. As the abrasive, alumina ($Al_2O_3$) is usable instead of colloidal silica. According to Embodiment 1, CMP as described above is employed for the polishing treatment to form the inlaid second-level interconnect L2, whereby the damage on the surface of the insulating film 11b polished by CMP treatment can be reduced drastically and scratch-free polishing can be accomplished.

After completion of the above-described polishing, the surface of the wafer 1W is subjected to anticorrosive treatment. The anticorrosion treatment section has a structure similar to that of the polishing treatment section. After mechanical removal of the polishing slurry, while pressing the main surface of the wafer 1W against a polishing pad attached to the surface of a polishing platen, a chemical solution containing an anticorrosive, for example, benzotriazole (BTA), is fed to the main surface of the wafer 1W, whereby a hydrophobic protective film is formed on the surface portion of a copper interconnect formed over the main surface of the wafer 1W.

The wafer 1W, after completion of the anticorrosive treatment, is temporarily stored in the dipping section in order to prevent its surface from drying. The dipping section serves to keep the surface of the wafer 1W, which has been subjected to anti-corrosive treatment, from drying until post-CMP cleaning starts. It has, for example, a structure capable of dipping and storing a predetermined number of wafers 1W in a dipping tank (stocker) having pure water that is caused to overflow. By supplying the dipping tank with pure water that is cooled enough so as not to allow substantial progress of electrochemical corrosion reaction of the inlaid second-level interconnect L2, corrosion of the inlaid second-level interconnect can L2 be prevented more completely. A method other than the above-described method of storing the wafer in a dipping tank may be adopted insofar as it can maintain the wet state of the surface of the wafer 1W, for example, by subjecting the wafer 1W to a pure-water shower.

Then, the wafer 1W is immediately transferred to the post-CMP cleaning step while keeping its surface wet. The wafer 1W is first subjected to alkali cleaning. This alkali cleaning is conducted for removing foreign matters, such as slurry, upon CMP treatment. The acid slurry attached to the wafer 1W by CMP is neutralized to arrange the zeta potentials of the wafer 1W, foreign matter and a cleaning brush to the same direction. In order to eliminate an adsorbing force among them, scrub cleaning (or brush cleaning) of the surface of the wafer 1W is conducted, while supplying thereto a weak alkali chemical solution having a pH of 8 or greater. As an alkali chemical solution, aminoethanol (DAE: Diluted Amino Ethanol, composition: 2-aminoethanol, $H_2NCH_2CH_2OH$, concentration: about 0.001% to 0.1%, preferably 0.01%) is employed. This chemical solution has less etching action relative to copper and has a detergency equivalent to $NH_4OH$. In the above-described cleaning, a roll type cleaning system is employed, but without limitation thereto, various other ones are usable. For example, a disc type cleaning system can be adopted upon alkali cleaning.

The wafer 1W (particularly, the CMP polished surface from which the inlaid second-level interconnect L2 is exposed) is then subjected to reduction treatment. More specifically, the wafer 1W (particularly, the CMP polished surface) is heat treated, for example, in a hydrogen gas atmosphere at 200 to 475° C., preferably 300° C., for 0.5 to 5 minutes, preferably about 2 minutes (hydrogen ($H_2$) annealing: Step 105 of FIG. 5). By this heat treatment, a copper oxide film generated on the surface of the inlaid second-level interconnect L2 upon CMP can be reduced into copper, whereby etching of the inlaid second-level interconnect L2 by the subsequent acid cleaning can be suppressed or prevented. This makes it possible to suppress or prevent an increase in the interconnect resistance, fluctuations in the interconnect resistance and appearance of a step difference simultaneously; and, moreover, it is possible to suppress or prevent generation of etch corrosion. When reduction treatment is not conducted, organic matter such as BTA that has adhered onto the surface of the wafer 1W upon CMP may serve as a mask upon cleaning and disturb smooth etching of the surface layer of the insulating film 11b. An organic matter such as BTA that has adhered upon CMP, can be removed when the reduction treatment is conducted, as in this Embodiment 1, so that the surface layer can be removed sufficiently and uniformly from the insulating film 11b. This enables a drastic improvement of the TDDB life of the resulting semiconductor integrated circuit device. In some cases, hydrogen annealing as described above is not necessary.

The wafer 1W is then subjected to acid cleaning. This acid cleaning is conducted for the improvement of the TDDB characteristics, removal of residual metals, reduction in the dangling bonds on the surface of the insulating film 12b and removal of unevenness on the surface of the insulating film 12b. An aqueous hydrofluoric acid solution is fed to the surface of the wafer 1W to remove foreign matter (particles) therefrom by etching. TDDB characteristics can be improved only by adding the cleaning step with hydrofluoric acid, which is presumed to be due to the removal of a damaged layer on the surface by acid cleaning and improvement in the adhesion on the interface. Brush scrub cleaning, for example, is employed for hydrofluoric acid (HF) cleaning, and it is conducted under the selected conditions of an HF concentration of 0.5% and a cleaning time of 20 seconds. In the above-described example, alkali cleaning is followed by reduction and then acid cleaning. Without limitation thereto, the order of the post-CMP cleaning treatment can be changed in various ways. For example, after CMP treatment, reduction, alkali cleaning and acid cleaning may be conducted in this order. Alternatively, alkali cleaning may be omitted and only acid cleaning is conducted, which means post-CMP treatment conducted in the order of reduction and acid cleaning after CMP treatment. The TDDB characteristics are improved only by acid cleaning, which is presumed to be due to an improvement of the characteristics of the interface by the removal of a damaged layer. Prior or in parallel to the post-CMP cleaning treatment, the surface of the wafer 1W may be subjected to pure-water scrub cleaning, pure-water ultrasonic cleaning, running pure water cleaning or pure water spin cleaning, or the back side of the wafer 1W may be subjected to pure-water scrub cleaning.

In this Embodiment 1, the whole of the CMP treating section, and the subsequent section, including the transfer chamber, anticorrosive chamber, dipping chamber (stocker), reduction chamber and cleaning chamber, are formed to have a light shielding structure in order to suppresss or prevent corrosion of the metal (here, the inlaid second-level interconnect L2) of the wafer 1W by electrochemical action, which otherwise occurs when the wafer 1W after CMP treatment is exposed to light. This phenomenon tends to occur particularly after elimination of the wafer 1W from the CMP apparatus after CMP treatment, but prior to the cleaning treatment. By forming the CMP treatment section and each chamber for the subsequent step to have a light shielding structure, the surface of the wafer 1W is protected from exposure to illumination right during these steps, making it possible to avoid generation of a short-circuit current due to a photovoltaic power effect, thereby suppressing or preventing corrosion of the metal. Such a light shielding structure is actualized by covering the CMP apparatus and chambers of the subsequent step with a light shielding sheet, thereby decreasing the illumination inside of each chamber to 500 lux or less, preferably 300 lux or less, more preferably 100 lux or less. After the above-described cleaning treatment, the wafer 1W is subjected to drying treatment using a spin drier, and, then, it is provided for the subsequent step.

After the post-CMP cleaning treatment, as described above, the wafer 1W is subjected to reduction plasma treatment as described below. More specifically, the wafer 1W (particularly, the CMP surface from which the inlaid second-level interconnect L2 is exposed) is subjected to hydrogen plasma treatment. This hydrogen plasma treatment is conducted under the below-described conditions when the wafer 1W has, for example, a diameter of 8 inches (about 200 mm): a treating pressure of 5.0 Torr (=6.6661×10² Pa), a radio frequency (RF) power of 600 W, substrate temperature of 400° C., a hydrogen gas flow rate of 500 cm³/min and a treating time of 10 to 30 seconds. The distance between electrodes is set at 600 mils (15.24 mm). As the treating gas, a single gas of hydrogen (H) or a mixed gas of hydrogen (H) and nitrogen (N) is employed.

Owing to a markedly high removing capacity of organic matter (higher than that of the ammonia plasma treatment which will be described later), this hydrogen plasma treatment almost completely removes BTA contained in the slurry or slurry components upon CMP, organic acids after post-CMP cleaning and residual organic matters generated during the process, making it possible to reduce a leak current on the interface. As a result, it contributes to a further improvement in the TDDB life.

Without release of the wafer 1W to the air after the above-described hydrogen plasma treatment, it is subjected to reduction treatment, as will be described below. More specifically, the wafer 1W (particularly, the CMP surface from which the inlaid second-level interconnect L2 is exposed) is subjected to ammonia (NH₃) plasma treatment. This ammonia plasma treatment is conducted under the following conditions when the wafer 1W has, for example, a diameter of 8 inches (about 200 mm): a treating pressure of 0.5 to 1.0 Torr (=66.6612 to 133.332 Pa), a pressure applied to the upper electrode of the plasma treatment apparatus of about 500 to 1000 W, a pressure applied to the lower electrode of the plasma treatment apparatus of about 0 to 1000 W (preferably, 0), a substrate temperature of about 300 to 400° C., an ammonia gas flow rate of 500 to 1500 cm³/min and a treating time of about 5 to 60 seconds. The distance between electrodes is set at 300 to 600 mils (7.62 to 15.24 mm).

By such ammonia plasma treatment, the copper oxide (CuO, CuO₂) on the surface of the copper interconnect that is oxidized by CMP is reduced to copper (Cu). In addition, a copper nitride (CuN) layer for preventing silicidation of copper upon set flow is formed over the surface (a very thin region) of the inlaid second-level interconnect L2. The SiN formation or SiH formation proceeds on the upper surface (very thin region) of the insulating film 12b between interconnects to compensate for dangling bonds on the surface of the insulating film 12b. In addition, the adhesion between the cap insulating film, which will be described later, and the inlaid second-level interconnect L2 or the insulating film 11b can be improved, leading to a reduction in leakage current on the interface. Such effects bring about an improvement in the TDDB life. When the above-described hydrogen plasma treatment and ammonia plasma treatment are conducted successively, it is possible to reduce the surface of the inlaid second-level interconnect L2 having copper as a main component, to form a silicide barrier layer and to attain cleaning, SiH and SiN effects of the interface of the insulating film 11b, leading to a further improvement in the reliability.

It is needless to say that the conditions of the reduction plasma treatment are not limited to those described above. In the above-described example, hydrogen plasma treatment is followed by ammonia plasma treatment. The reduction treatment is not limited thereto, but can be changed in various ways. For example, after ammonia plasma treatment, hydrogen plasma treatment may be conducted while maintaining the vacuum state. Alternatively, the reduction treatment may comprise only ammonia plasma treatment. Even in such a case, the TDDB life can be improved.

Figure 9:
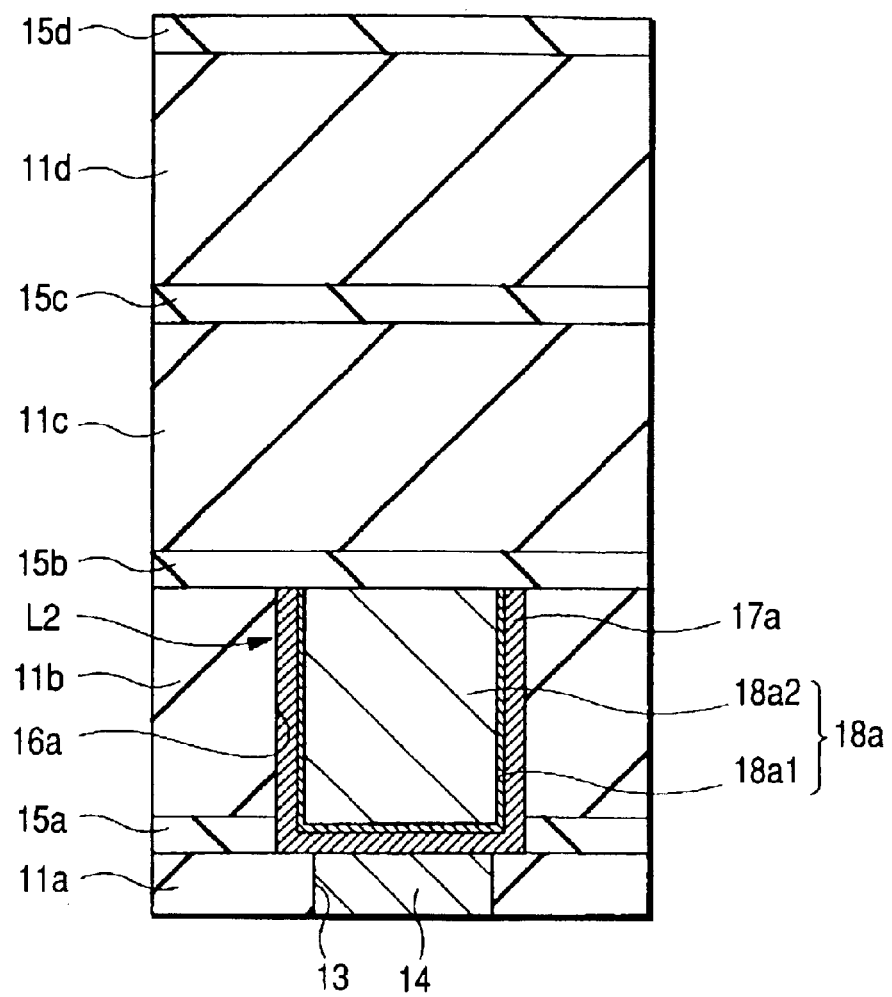
FIG. 9 is a fragmentary enlarged cross-sectional view of an interconnect trench formation portion of the semiconductor device, as seen in a manufacturing step following that of FIG. 7.

FIG. 9 is a fragmentary enlarged cross-sectional view of the interconnect formation portion of the semiconductor device, as seen in a manufacturing step following that of FIG. 7. In this step, as a continuation of the processing after the ammonia plasma treatment, an insulating film 15b is deposited over the insulating film 11b and inlaid second-level interconnect L2 by plasma CVD in the plasma treatment chamber in which ammonia plasma treatment was conducted, while maintaining the vacuum state without releasing the wafer to the air. The material, thickness and method of formation of the insulating film 15b are similar to those of the insulating film 15a, so that a description thereof is omitted. Then, over the insulating film 15b, insulating films 11c, 15c, 11d, and 15d are deposited in this order. The material and method of formation of the insulating film 11c are similar to those of the insulating film 11a or 11b, so that a description thereof is omitted. The material, thickness and method of formation of the insulating films 15c and 15d are similar to those of the insulating films 15a and 15b, so that a description thereof is also omitted.

Figure 10:
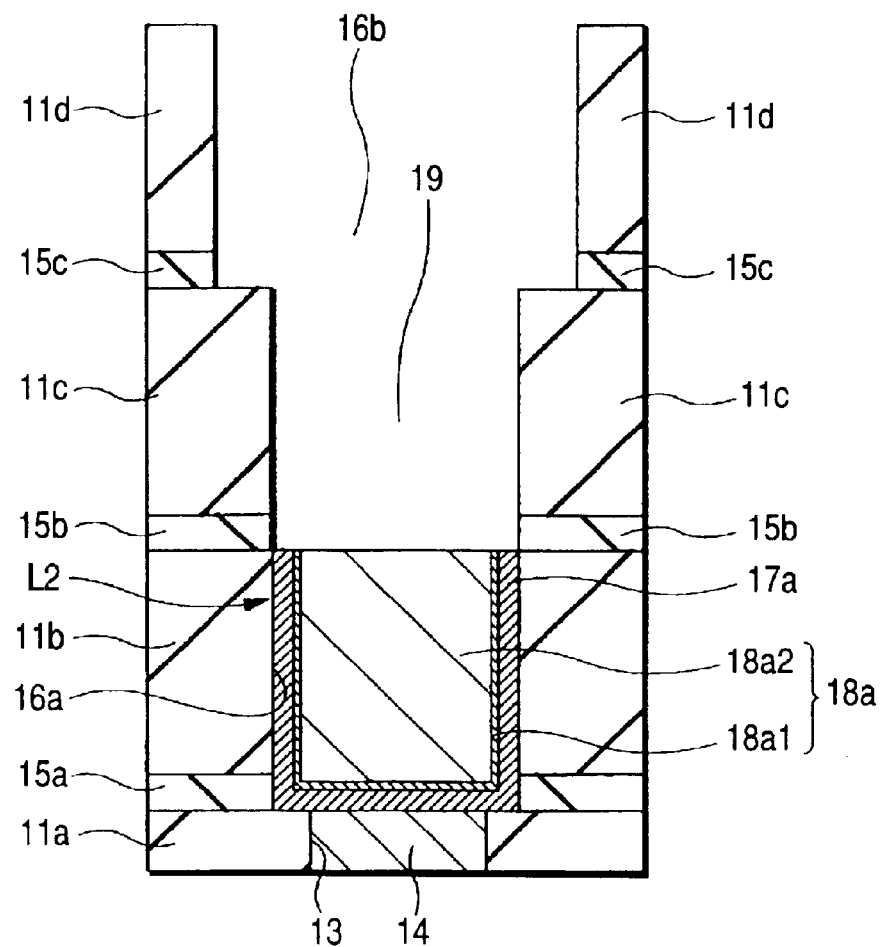
FIG. 10 is a fragmentary enlarged cross-sectional view of an interconnect formation portion of the semiconductor device, as seen in a manufacturing step following that of FIG. 9.

FIG. 10 is a fragmentary enlarged cross-sectional view of the interconnect formation portion of the semiconductor device, as seen in a manufacturing step following that of FIG. 9. In this step, by photolithography and dry etching, a flat and strip-shaped interconnect trench (interconnect opening portion) 16b is formed in the insulating films 11d,15c and a flat and disc-shaped through-hole (interconnect opening portion) 19 extending from the bottom of the interconnect trench 16b toward the upper surface of the inlaid second-level interconnect L2 is formed in the insulating films 11c,15b.

The through-hole 19 has a diameter of, for example, about 0.18 μm. The insulating film 15d in FIG. 9 is removed by etching simultaneously with formation of an opening for the through-hole 19 by etching.

Figure 11:
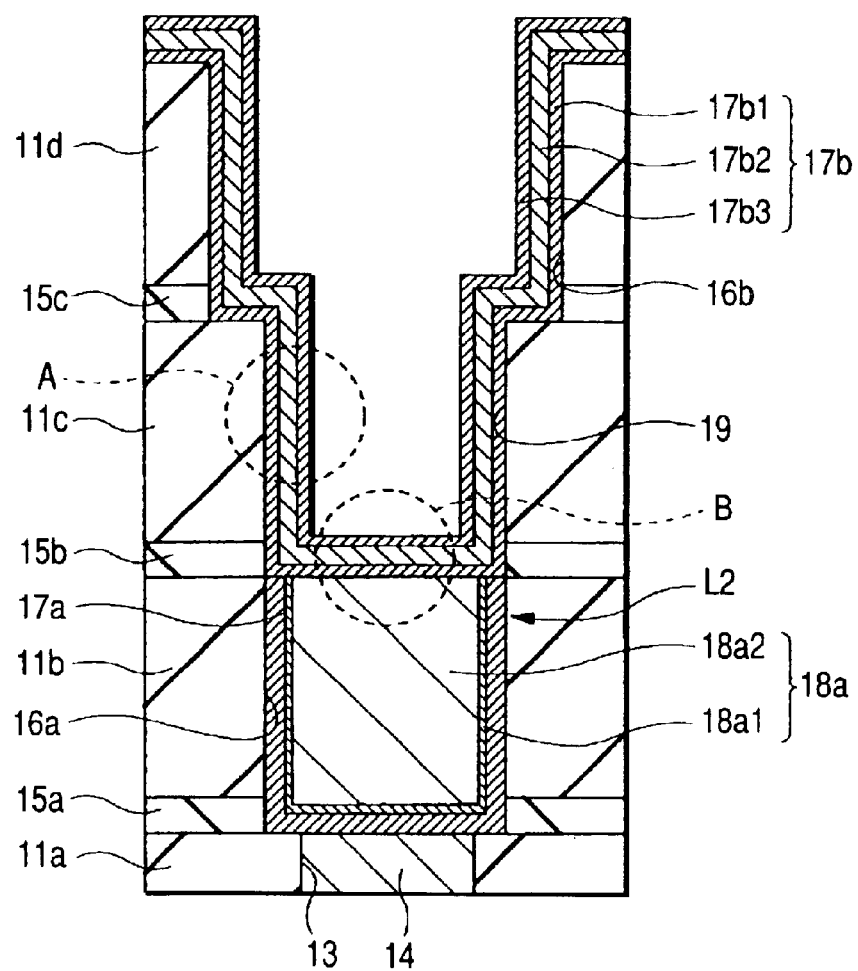
FIG. 11 is a fragmentary enlarged cross-sectional view of the interconnect formation portion of the semiconductor device, as seen in an manufacturing step following that of FIG. 10.
Figure 12:
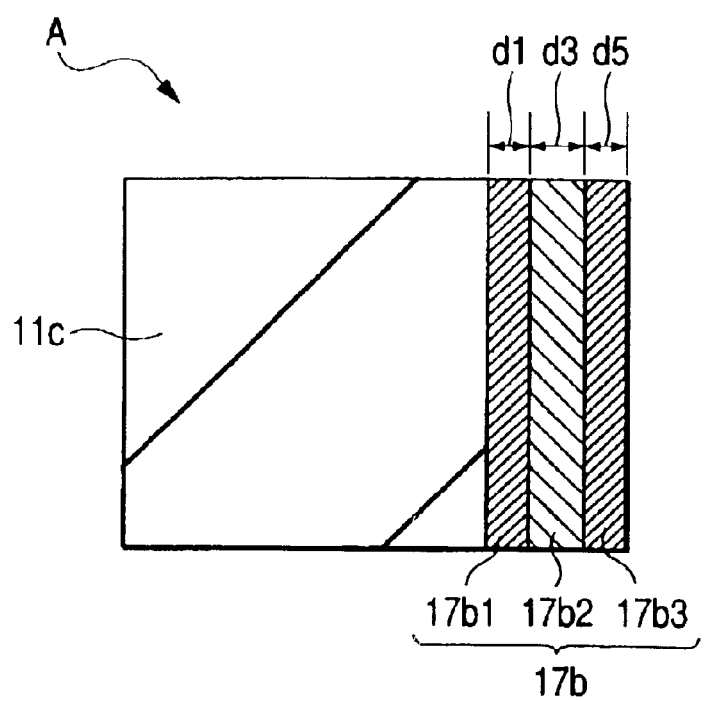
FIG. 12 is a cross-sectional view of the region A of FIG. 11.
Figure 13:
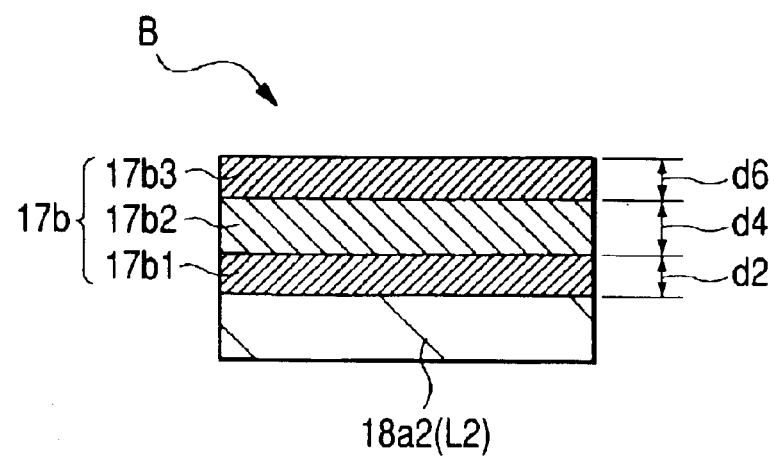
FIG. 13 is a cross-sectional view of the region B of FIG. 11.

FIG. 11 is a fragmentary enlarged cross-sectional view of the interconnect formation portion of the semiconductor device, as seen in a manufacturing step following that of FIG. 10; and FIGS. 12 and 13 are cross-sectional views of the regions A and B of FIG. 11, respectively. In this step, a conductive barrier film 17b is deposited over the insulating film 11d and inside of the interconnect trench 16b and through-hole 19 of the wafer 1W. The conductive barrier film 17b does not completely fill the interconnect trench 16b and through-hole 19, but is thinly adhered to the inside surface (side surfaces and bottom surface) thereof. In this Embodiment 1, the conductive barrier film 17b has a laminated structure of three conductor films 17b1,17b2,17b3.

The conductor film (first conductor film) 17b1, which is an undermost layer, serves to mainly improve the adhesion between the conductive barrier film 17b and another material. Disposal of such a conductor film 17b1 improves the adhesion between the conductive barrier film 17b and the insulating film, so that peeling of the conductive barrier film 17b can be suppressed or prevented. In addition, compared with the conductive barrier film 17b composed singly of a titanium silicon nitride film, disposal of this conductor film makes it possible to improve the adhesion between the conductive barrier film 17b and the main conductor film 18a2 of the inlaid second-level interconnect L2 composed mainly of copper, leading to an improvement in the EM resistance at the bottom of the through-hole 19. It also suppresses or prevents occurrence of conduction failure which will otherwise occur owing to peeling of the main conductor film 18a2, that is composed mainly of copper, from the conductive barrier film 17b at the bottom of the through-hole 19. Moreover, owing to an improvement in the adhesion between the conductive barrier film 17b and the main conductor film 18a2 at the bottom of the through-hole 19, generation of voids, which will otherwise occur at the bottom (above the main conductor film 18a2) of the through-hole 19 owing to stress migration, can be suppressed or prevented. This leads to a reduction in the resistance at the bottom of the through-hole 19. In this step, by selecting, for example, tantalum (Ta) as the material of the conductor film 17b1, it is possible to impart it with a function of improving adhesion between the conductive barrier film 17b and insulating films 11c,11d,15b,15c or the main conductor film 18a2 made of copper, and, at the same time, to impart it with a function as a copper-diffusion barrier. The conductor film 17b1 is formed, for example, by sputtering, MOCVD or atomic-layer deposition (ALD). When deposition of the conductor film 17b1 is conducted particularly by sputtering, the adhesion with the insulating films 11c,11d,15a,15c can be improved. As illustrated in FIG. 12, the conductor film 17b1 has, on the side walls in the through-hole 19, a thickness dl of about 2 nm or less. The thickness of the conductor film 17b can be made thinner when formed by ALD than any other film formed by sputtering or CVD. The formation of, for example, a titanium nitride (TiN) film by ALD will be described next. A TiCl$_4$ layer corresponding to one atomic layer is deposited over the side walls and bottom surface of the through-hole 19 and interconnect trench 16b by using TiCl$_4$ as a Ti-containing gas. Then, the surface of the TiCl$_4$ layer thus deposited is cleaned by etching with an Ar gas.

Then, a chemical reaction is caused between the TiCl$_4$ layer and the NH$_3$ used as a nitrogen-containing gas, followed by cleaning by etching with an Ar gas to obtain a TiN layer corresponding to one molecule. A TiN layer having a thickness of 2 nm or less is available by repeating the above-described step. The ALD film thus formed is superior in coverage to a CVD film and has a good film quality, because the film is formed by repeating deposition of a layer corresponding to one molecule. The above-described method is not limited to TiN, but even a film containing another material can be formed freely merely by changing the raw material gas. As illustrated in FIG. 13, the conductor film 17b1 at the bottom of the through-hole 19 is, for example, 3 nm or less. Examples of another material for the conductor film 17b1 include refractory metals, such as titanium (Ti) and niobium (Nb), nitrides of a refractory metal, such as tantalum nitride and titanium nitride, a laminate film obtained by stacking tantalum over tantalum nitride, a laminate film obtained by stacking titanium over titanium nitride, silicides of a refractory metal, such as tantalum silicide (TaSi$_x$), titanium silicide (TiSi$_x$), copper silicide (CuSi) and niobium silicide (NbSi$_x$), materials obtained by adding silicon (Si) to a nitride of a refractory metal, such as tantalum silicon nitride (TaSiN), and silicon.

The intermediate conductor film (second conductor film) 17b2 is a film mainly having a function of suppressing or preventing copper diffusion. The conductor film 17b2 is made of, for example, titanium silicon nitride (TiSiN) and is formed, for example, by MOCVD or ALD (Atomic Layer Deposition). The step coverage of the conductor film 17b2 in the interconnect trench 16b and through-hole 19 can be improved by forming the conductor film 17b2 by MOCVD or ALD. For example, the thickness of the conductor film 17b2 deposited inside (on side surfaces and bottom surface) of the thorough-hole 19 can be made about 60% of the thickness of the conductor film 17b2 deposited over the insulating film 11c. This eliminates the necessity of depositing the conductor film 17b2 with excessive thickness, making it possible to suppress or prevent the generation of an overhang of the conductive barrier film 17b at the upper opening portion of the through-hole 19. In addition, the conductive barrier film 17b inside of the interconnect trench 16b and through-hole 19 can be formed as a thin film, which makes it possible to sufficiently fill the interconnect trench 16b and through-hole 19 with a main conductor film composed mainly of copper and to increase the capacitance of the main conductor film. This leads to a reduction in the resistance at the inlaid interconnect portion and through-hole 19 portion. As illustrated in FIG. 12, the thickness d3 of the conductor film 17b2 on the side walls inside of the through-hole 19 is, for example, 3 nm or less. As illustrated in FIG. 13, the thickness d4 of the conductor film 17b2 on the bottom of the through-hole 19 is, for example, 3 nm or less. As a method of forming the conductor film 17b2 made of titanium silicon nitride, thermal CVD using a mixture of a titanium-containing gas and a silicon-containing gas, or a mixture of a titanium-containing gas, a silicon-containing gas and a nitrogen-(N)-containing gas, can be given as an example. As the titanium-containing gas, at least one of $TiCl_4$, tetraxydiethylaminoethanol and tetraxydimethylaminoethanol is usable. As the silicon-containing gas, at least one of silane gases, such as $SiH_2Cl_2$, $SiHCl_3$, $SiCl_4$, $Si_2H_4$, and $SiH_4$, is usable. As the nitrogen-containing gas, at least one of a mixed gas of ammonia ($NH_3$) and monomethyl hydrazine and a nitrogen gas ($N_2$) is usable. A description will next be made of the method of forming the titanium silicon nitride (TiSiN) film by CVD. For example, a titanium nitride (TiN) film is formed by using the above-described titanium-containing gas and nitrogen-containing gas. Silicon is then added to the surface of the resulting TiN film by using the silicon-containing gas to form a TiSiN film. Use of a monosilane gas ($SiH_4$) as the silicon-containing gas is preferred. In this case, the conductor film 17b2 has a titanium silicon nitride (TiSiN) layer and a titanium nitride layer stacked one after another, with the former one constituting the surface layer.

The following is a method of forming a TiSiN film by ALD. First, using $TiCl_4$ as the titanium-containing gas, a $TiCl_4$ layer corresponding to one molecule is deposited on the sidewalls and bottom surface in the through-hole 19 and interconnect trench 16b. Then, an Ar gas is introduced to clean the surface of the $TiCl_4$ layer. A chemical reaction with the $TiCl_4$ layer corresponding to one molecule is caused by using $NH_3$ as the nitrogen-containing gas. Then, an Ar gas is used to clean the surface, whereby TiN corresponding to one molecule is obtained. As the silicon-containing gas, an $SiH_4$ gas is used to react with the TiN layer, whereby a TiSiN layer corresponding to one molecule is obtained. A TiSiN layer having a thickness of about 2 nm or less is available by repeating the above-described operations. Alternatively, a TiSiN layer having a thickness of about 2 nm or less is available by the addition of Si onto the surface of the TiN layer corresponding to one molecule by using an $SiH_4$ gas as the silicon-containing gas. The coverage of the through-hole 19 and interconnect trench 16b can be improved further by the use of ALD that is capable of forming a thinner film than CVD. In addition, a film is formed by depositing a layer corresponding to one molecule in repetition so that the film thus obtained is dense and has a good film quality. A film containing another material can also be formed freely merely by changing the raw material gas. The film is not limited to TiN.

This will equally apply to the ALD film, which will be described in another embodiment later. The temperature of the wafer 1W upon formation of the conductor film 17b2 is, for example, about 250 to 700° C. Examples of another material for the conductor film 17b2 include materials, such as a tantalum silicon nitride (TaSiN) film, obtained by adding silicon to a refractory metal nitride and titanium nitride.

The uppermost conductor film (third conductor film) 17b3 has mainly a function of improving the adhesion between the conductive barrier film 17b and a conductor film composed mainly of copper. By the disposal of such a conductor film 17b3, adhesion between the main conductor film composed mainly of copper, which film is to be embedded in the interconnect trench 16b and through-hole 19, and the conductive barrier film 17b can be improved compared with the case where the conductive barrier film 17 is formed of a monolayer film of titanium silicon nitride. It also contributes to an improvement in the EM resistance at the through-hole 19. In addition, generation of conduction failure, which will otherwise occur owing to the peeling of the main conductor film composed mainly of copper from the conductive barrier film 17b in the through-hole 19, can be suppressed or prevented. This leads to a reduction in the resistance at the through-hole 19. In this step, by selecting tantalum as the material for the conductor film 17b3, it is possible to allow the conductor film 17b3 to have both a function of improving the adhesion between the conductive barrier film 17b and a main conductor film composed of copper, which will be formed later as a constituent of an inlaid third-level interconnect, and the function of a copper-diffusion barrier. The conductor film 17b3 is formed by sputtering, MOCVD or ALD. The adhesion with the conductor film 17b2 can be improved by depositing the conductor film 17b3 by sputtering. As illustrated in FIG. 12, the thickness d5 of the conductor film 17b3 on the sidewalls in the through-hole 19 is, for example, 2 nm or less, while the thickness d6 of the conductor film 17n3 on the bottom in the through-hole 19 is, for example, 3 nm or less. Examples of another material for the conductor film 17b3 include refractory metals, such as titanium and niobium, nitrides of a refractory metal, such as tantalum nitride and titanium nitride, a laminate film having tantalum stacked over tantalum nitride, a laminate film having titanium stacked over titanium nitride, silicides of a refractory metal, such as tantalum silicide, titanium silicide, copper silicide and niobium silicide, materials obtained by adding silicon (Si) to nitrides of a refractory metal, such as tantalum silicon nitride, and silicon.

Figure 14:
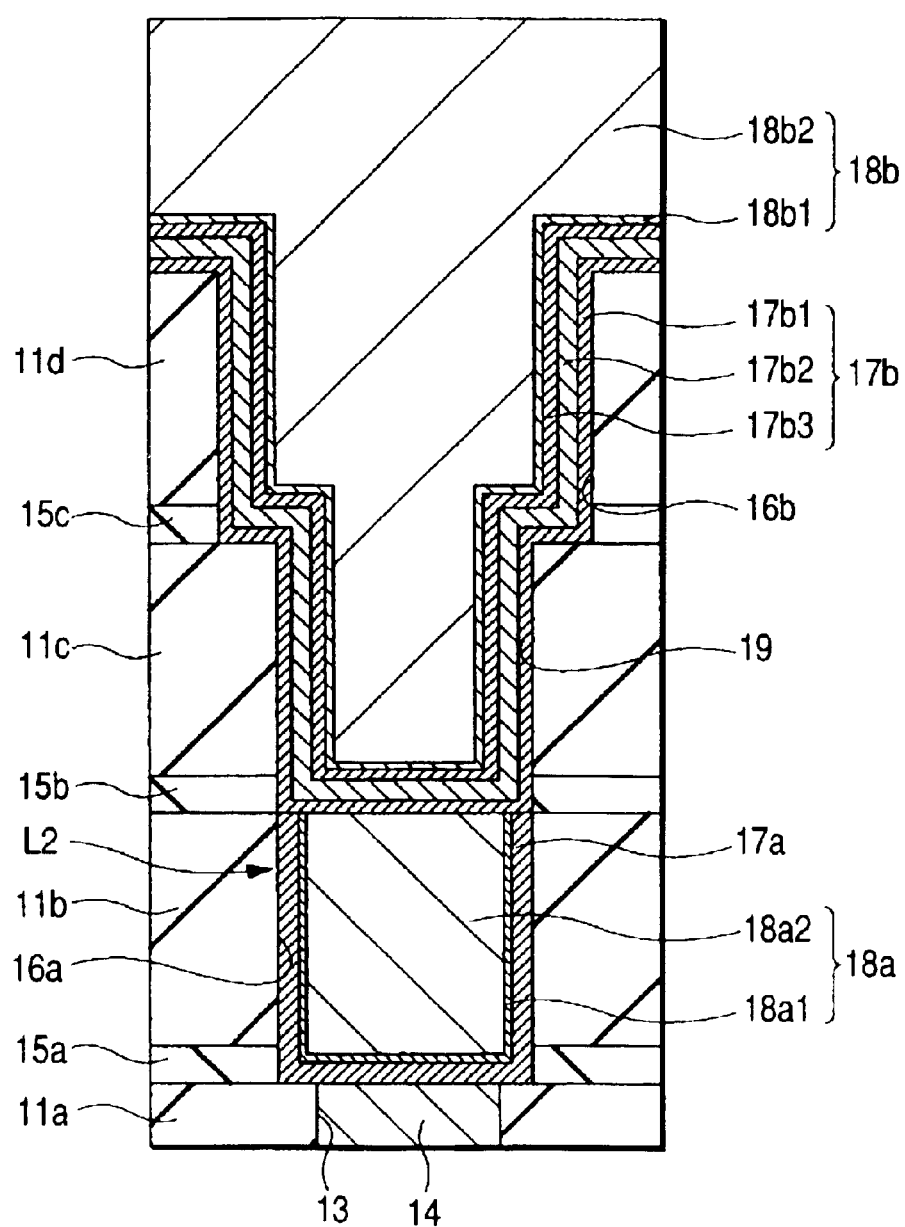
FIG. 14 is a fragmentary enlarged cross-sectional view of the interconnect formation portion of the semiconductor device, as seen in a manufacturing step following that of FIG. 11.

FIG. 14 is a fragmentary enlarged cross-sectional view of the interconnect formation portion of the semiconductor device, as seen in a manufacturing step following that of FIG. 11. In this step, similar to the main conductor film 18a of the inlaid second-level interconnect L2, a main conductor film (fourth conductor film) 18b is formed by depositing a thin conductor film 18b1 made of copper by sputtering over the conductive barrier film 17b (conductor film 17b3) and allowing a relatively thick conductor film 18b2 made of copper to grow thereover, for example, by use of a plating or electroplating method. Sputtering or CVD may be employed alternatively for the formation of the main conductor film 18b, as in the formation of the main conductor film 18a. After deposition of the main conductor film 18b, the wafer 1W is heat treated, for example, in a non-oxidizing atmosphere (for example, hydrogen atmosphere) at about 475° C. to cause reflow of the main conductor film 18b, whereby copper is filled completely inside of the interconnect trench 16b and through-hole 19. In this Embodiment 1, since the conductive barrier film 17b is thin without an overhang in the interconnect trench 16b and through-hole 19, as described above, copper of the main conductor film 18b2 can be filled well in the interconnect trench 16b and through-hole 19. In addition, owing to the conductor film 17b3 that is formed as a film for improving adhesion with the main conductor film 18b, generation of a conduction failure, which will otherwise occur by peeling of the main conductor film 18b from the conductive barrier film 17b can be suppressed or prevented. This brings about an improvement in EM resistance in the through-hole 19. Moreover, since the main conductor film 18b to be embedded in the through-hole 19 is composed mainly of copper, the resistance at the through-hole 19 portion can be reduced. Since the adhesion between the conductive barrier film 17b and insulating film can be improved by the formation of the conductor film 17b1, peeling of the conductive barrier film 17b can be suppressed or prevented. It can also suppress or prevent the generation of conduction failure which will otherwise occur by peeling, in the bottom of the through-hole 19, of the main conductor film 18a2, which is composed mainly of copper, from the conductive barrier film 17b.

Figure 15:
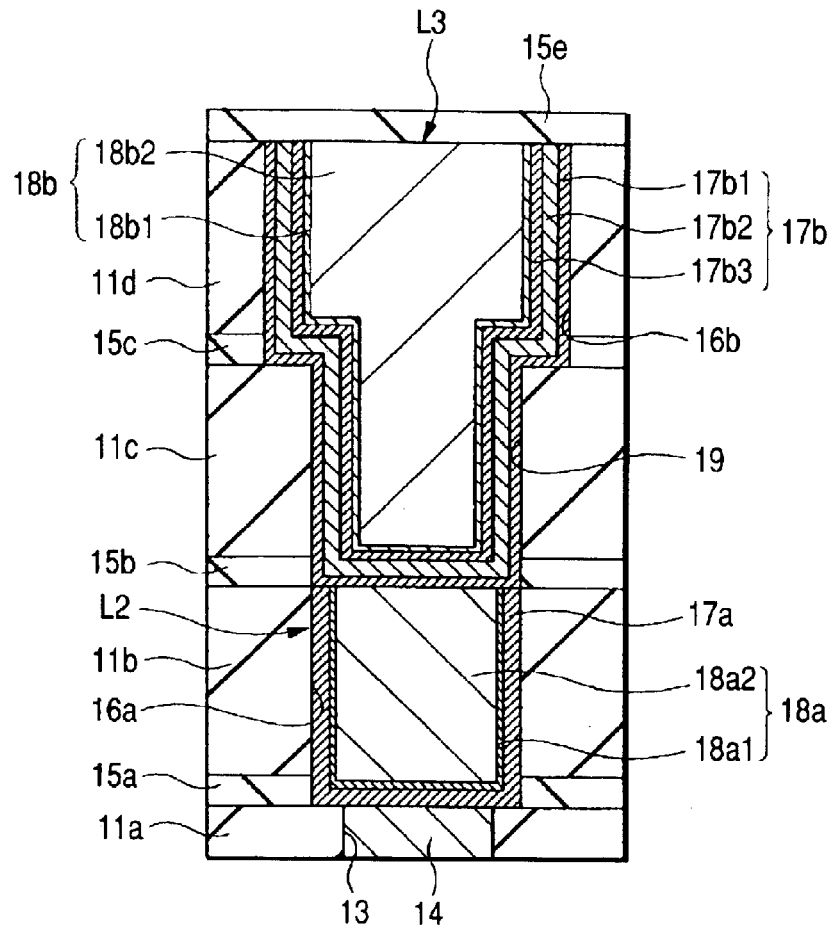
FIG. 15 is a fragmentary enlarged cross-sectional view of the interconnect formation portion of the semiconductor device, as seen in an manufacturing step following that of FIG. 14.
Figure 16:
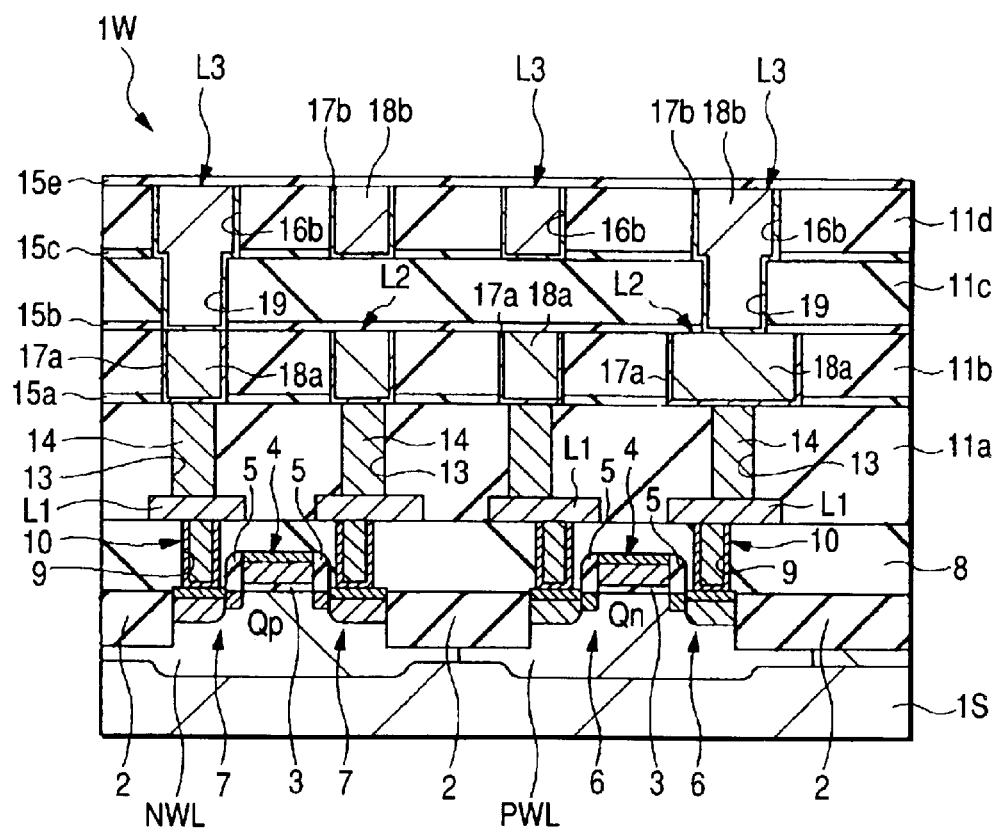
FIG. 16 is a fragmentary cross-sectional view of one example of a wafer, as seen in a manufacturing step of the semiconductor device of FIG. 15.

FIG. 15 is a fragmentary enlarged cross-sectional view of an interconnect formation portion of the semiconductor device, as seen in a manufacturing step following that of FIG. 14; and FIG. 16 is a fragmentary cross-sectional view of one example of the wafer of the semiconductor device, as seen in the manufacturing step of FIG. 15. In this step, the main conductor film 18b and conductive barrier film 17b, as illustrated in FIG. 14, are polished by CMP similar to that employed for the formation of the inlaid second-level interconnect L2, whereby an inlaid third-level interconnect L3 is formed in the interconnect trench 16b and through-hole 19, as illustrated in FIG. 15. The inlaid third-level interconnect L3 has a relatively thin conductive barrier film 17b formed by MOCVD or ALD, which is thinner than a film formed by sputtering, and a relatively thick main conductor film 18b, and it is electrically connected to the inlaid second-level interconnect L2 via the through-hole 19. After a similar treatment to that employed upon the formation of the inlaid second-level interconnect L2, an insulating film (second insulating film) 15e, serving as an interconnect cap, is formed over the insulating film 11c and inlaid third-level interconnect L3 as in the formation of the insulating film 15b. The material and thickness of the insulating film 15e are similar to those of the insulating films 15a,15b,15c.

Figure 17:
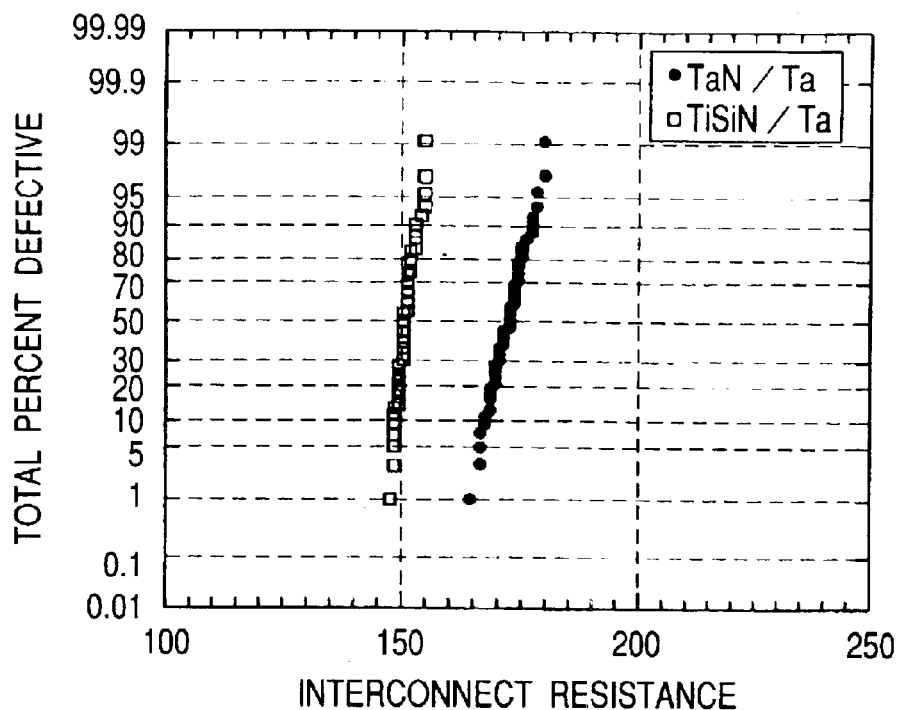
FIG. 17 is a graph of an interconnect resistance of an inlaid interconnect of the one embodiment of the present invention, as compared with an interconnect resistance of an inlaid interconnect structure investigated by the present inventors.

FIG. 17 is a graph of the interconnect resistance of an inlaid interconnect (here, the inlaid third-level interconnect) formed as in Embodiment 1, as compared with the interconnect resistance of an inlaid interconnect structure investigated by the present inventors. White squares each represent a measuring point of an interconnect resistance in the case where tantalum is interposed between copper and a titanium silicon nitride film according to Embodiment 1, while black circles each represent a measuring point of an interconnect resistance in the case where a film having tantalum stacked over tantalum nitride is used as a conductive barrier film according to the technique investigated by the present inventors. It should be apparent from FIG. 17 that the interconnect resistance can be lowered according to Embodiment 1.

Figure 18:
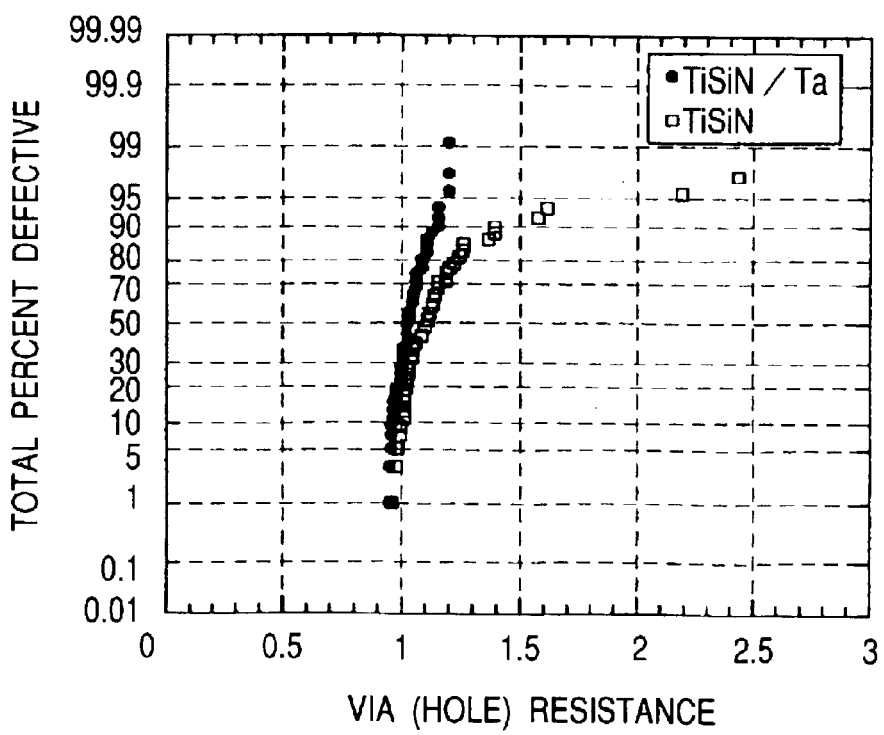
FIG. 18 is a graph of a resistance (via resistance) at the hole portion of the inlaid interconnect of the one embodiment of the present invention, as compared with a via resistance of the inlaid interconnect structure investigated by the present inventors.

FIG. 18 is a graph of the resistance (via resistance), at the through-hole 9, of an inlaid interconnect (here, the inlaid third-level interconnect L3) that is formed as in Embodiment 1, as compared with a via resistance of an inlaid interconnect structure that was investigated by the present inventors. Black circles each represent a measuring point of a via resistance in the case where tantalum is interposed between copper and a titanium silicon nitride film according to Embodiment 1, while white squares each represent a measuring point of a via resistance in the case where a titanium silicon nitride monolayer film is employed as the conductive barrier film according to the technique investigated by the present inventors. It should be apparent from FIG. 18 that the via resistance also can be lowered according to Embodiment 1.

Figure 19:
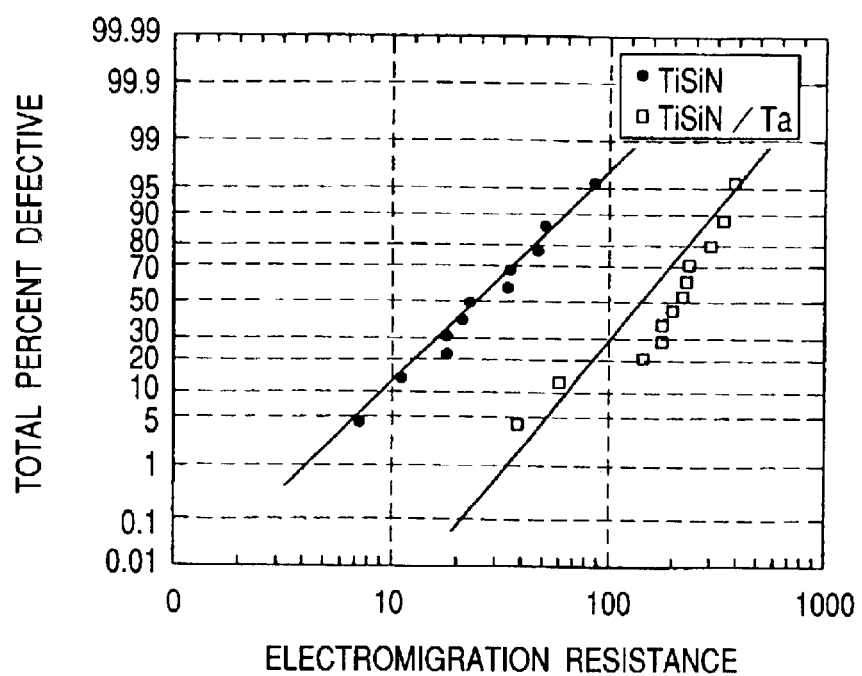
FIG. 19 is a graph of electromigration resistance (reliability) of the inlaid interconnect of the one embodiment of the present invention, as compared with electromigration resistance of the inlaid interconnect structure investigated by the present inventors.

FIG. 19 is a graph of the electromigration (which will hereinafter be abbreviated as "EM") resistance (reliability) of an inlaid interconnect (here, the inlaid third-level interconnect L3) formed as in Embodiment 1, as compared with EM resistance of an inlaid interconnect structure that was investigated by the present inventors. White squares each represent a measuring point of an EM resistance in the case where tantalum is interposed between copper and a titanium silicon nitride film according to Embodiment 1, while black circles each represent a measuring point of an EM resistance in the case where a titanium silicon nitride monolayer film is used as a conductive barrier film according to the technique investigated by the present inventors. It should be apparent from FIG. 19 that the EM resistance (reliability) can be improved according to Embodiment 1.

(Embodiment 2)

Figure 20:
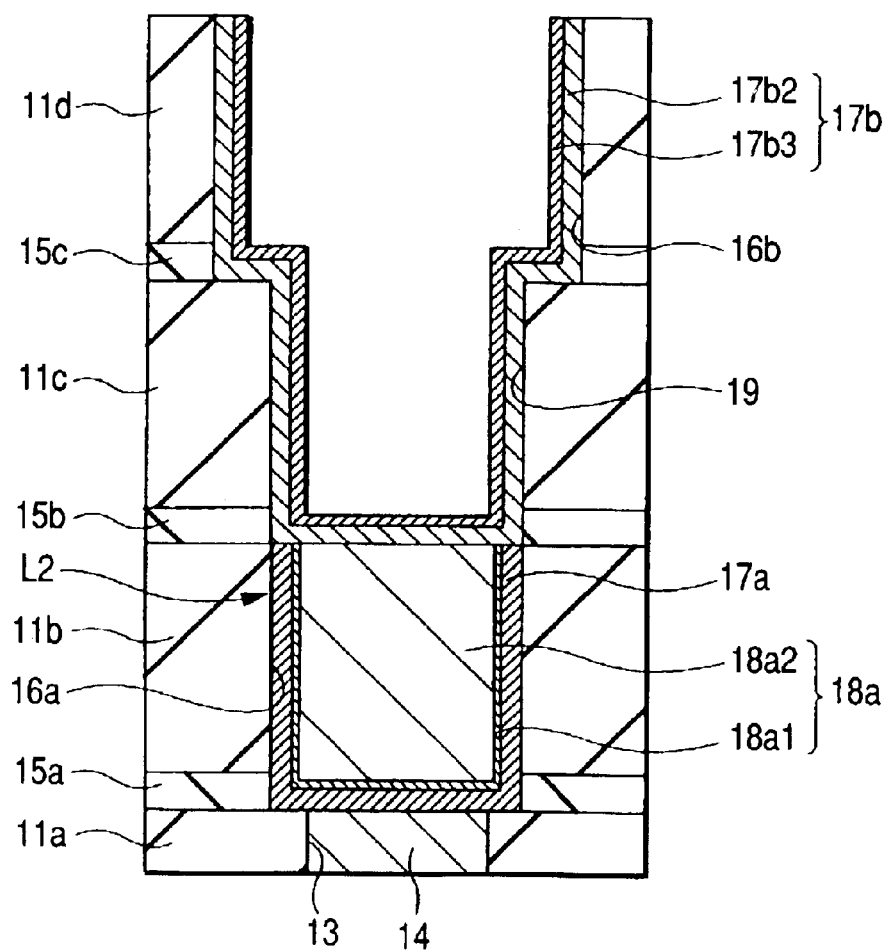
FIG. 20 is a fragmentary enlarged cross-sectional view of an interconnect formation portion of a semiconductor device, as seen in a manufacturing step thereof, according to another embodiment of the present invention.
Figure 21:
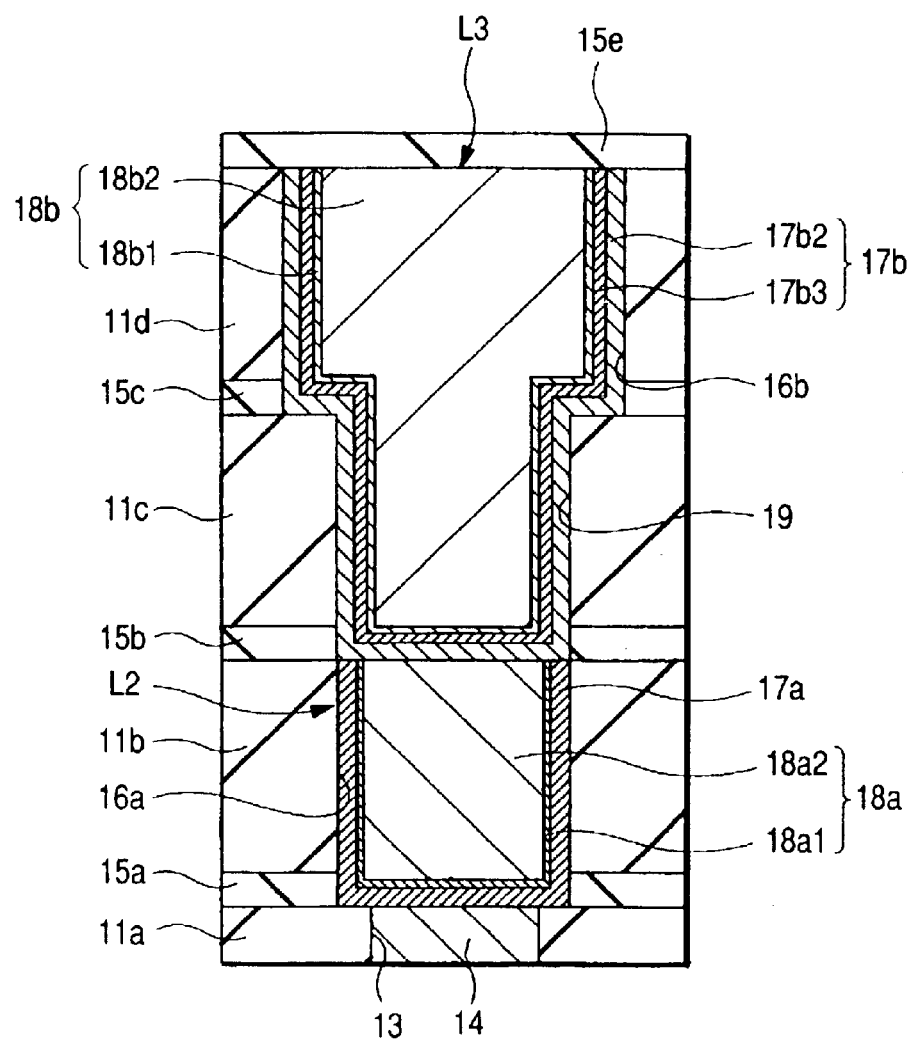
FIG. 21 is a fragmentary enlarged cross-sectional view of the interconnect formation portion of the semiconductor device, as seen in a manufacturing step following that of FIG. 20.

In this Embodiment 2, a conductive barrier film is formed to have a double layer structure composed of conductor films. This structure will be described with reference to FIGS. 20 and 21. FIG. 20 is a fragmentary enlarged cross-sectional view of an interconnect formation portion of a semiconductor device, as seen a manufacturing step thereof, according to Embodiment 2; and FIG. 21 is a fragmentary enlarged cross-sectional view of the interconnect formation portion of the semiconductor device as seen in a manufacturing step following that of FIG. 20.

In this Embodiment 2, after the steps as described with reference to FIGS. 1 to 10 of Embodiment 1, a conductive barrier film 17b having two conductor films 17b2,17b3 is deposited over the insulating film 11d of the wafer 1W, and in the interconnect trench 16b and through-hole 19. Also, in this case, the conductive barrier film 17b is not completely filled in the interconnect trench 16b and through-hole 19, but is adhered thinly to the insides thereof (side surfaces and bottom surface). With the formation of the conductor film 17b2 by CVD or ALD, as in Embodiment 1, the step coverage of the conductor film 17b2 in the interconnect trench 16b and through-hole 19 can be improved, whereby generation of an overhang of the conductive barrier film 17b at the upper opening portion of the through-hole 19 can be suppressed or prevented, and the conductive barrier film 17b inside of the interconnect trench 16b and through-hole 19 can be formed as a thin film, which makes it possible to sufficiently fill the interconnect trench 16b and through-hole 19 with a main conductor film composed mainly of copper and to increase the capacitance of the main conductor film. This leads to a reduction in the resistance at the inlaid interconnect portion and through-hole 19 portion. In addition, by providing the conductor film 17b3, adhesion between the main conductor film composed mainly of copper, which film is to be embedded in the interconnect trench 16b and through-hole 19, and the conductive barrier film 17b can be improved as compared with the case in which the conductive barrier film 17b is formed only of a titanium silicon nitride film. As a result, the EM resistance in the through-hole 19 is improved and, furthermore, generation of conduction failure, which will otherwise occur owing to the peeling of the main conductor film composed mainly of copper from the conductive barrier film 17b in the through-hole 19, can be suppressed or prevented. This also reduces the resistance at the through-hole 19 portion. The conductor film 17b3 is preferably formed by sputtering. In such case, adhesion between the main conductor film composed mainly of copper and embedded in through-hole 19 and the conductive barrier film 17b can be improved, compared with that when the conductor film 17b3 is formed by CVD. The thickness of the conductor films 17b2, 17b3 on the side surfaces and bottom surface of the through-hole 19 are similar to those in Embodiment 1. The conductor film 17b can be formed so as to be thinner by ALD than that formed by CVD, so it exhibits good coverage, and, moreover, the film thus formed is dense and has improved film quality. Then, as illustrated in FIG. 21, a main conductor film 18b, composed mainly of copper, is deposited over the wafer 1W, as in Embodiment 1, followed by polishing of an unnecessary portion of the main conductor film 18b and the underlying conductive barrier film 17b by CMP, whereby an inlaid third-level interconnect L3 is formed. Then, as in Embodiment 1, after post-CMP treatment, an insulating film 15e, serving as an interconnect cap, is deposited.

According to Embodiment 2, the following effects, in addition to the effects available by Embodiment 1, can be obtained. More specifically, since the conductive barrier film 17b can be made thinner than that in Embodiment 1, the capacitance of copper in the interconnect trench 16b and through-hole 19 can be increased, and, therefore, the resistance at the inlaid interconnect and through-hole 19 portions can be made smaller than that in Embodiment 1 In addition, the steps used in forming the conductor films can be reduced, leading to shortening of the manufacturing time in the formation of a semiconductor device. It also leads to a reduction in the manufacturing cost of the semiconductor device.

(Embodiment 3)

In this Embodiment 3, a semiconductor device, wherein an interlayer insulating film is provided in the form of a low-dielectric-constant insulating film (Low-K insulating film), will be described. The term "low-dielectric-constant insulating film" means an insulating film having a dielectric constant lower than that of a silicon oxide film (for example, TEOS (Tetraethoxysilane) oxide film). The specific dielectric constant of the TEOS oxide film is usually about 4.1 to 4.2.

Figure 22:
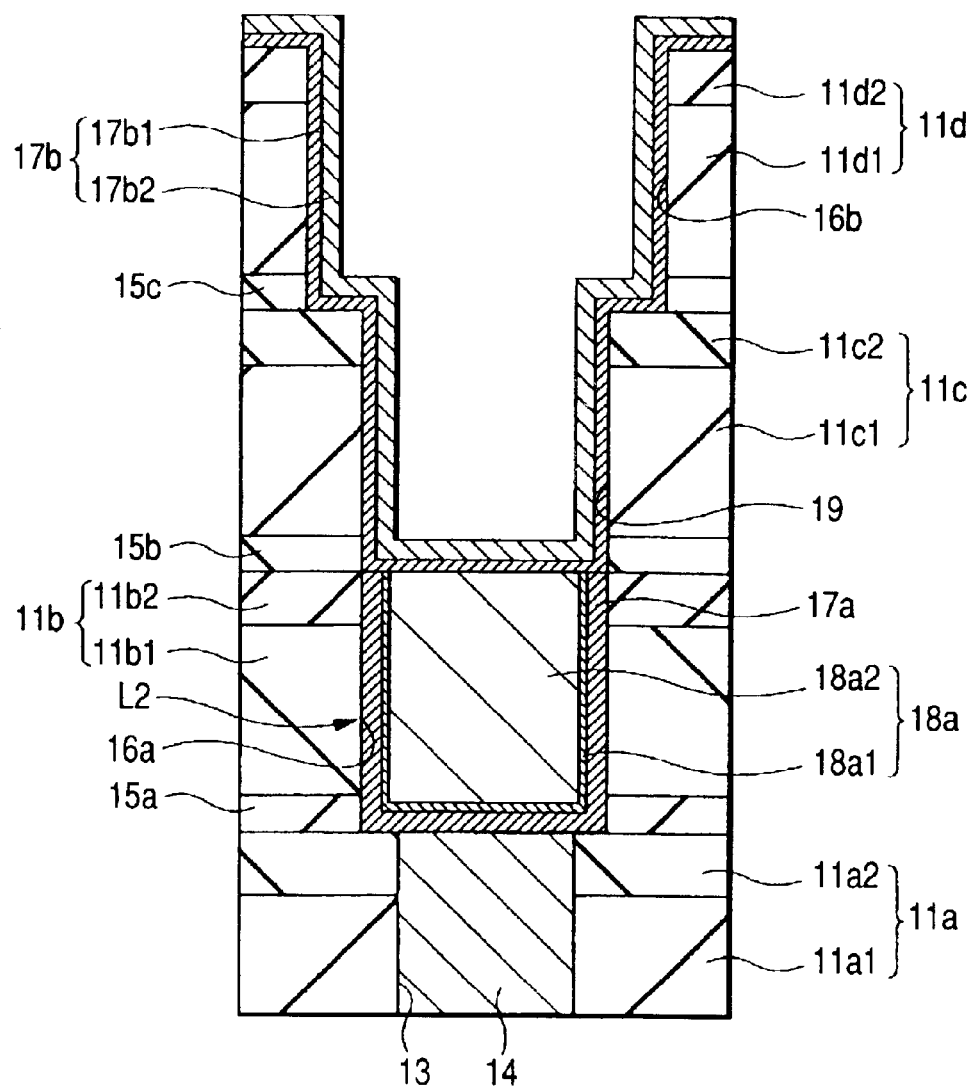
FIG. 22 is a fragmentary cross-sectional view of an interconnect formation portion, as seen in a manufacturing step thereof, of a semiconductor device according to a further embodiment of the present invention.

FIG. 22 is a fragmentary cross-sectional view of an interconnect formation portion of a semiconductor device, as seen in a manufacturing step similar to that illustrated in FIG. 11, after the manufacturing steps similar to those illustrated in FIGS. 1 to 10 of Embodiment 1. In Embodiment 3, an insulating film 11a has an insulating film 11a2 stacked over an insulating film 11a1, an insulating film 11b has an insulating film 11b2 stacked over an insulating film 11b1, an insulating film 11c has an insulating film 11c2 stacked over an insulating film 11c1, and an insulating film 11d has an insulating film 11d2 stacked over an insulating film 11d1. The insulating films 11a1, 11b1, 11c1, 11d1 are each made of a low-dielectric-constant insulating film (Low-K insulating film), such as an organic polymer or organic silica glass. Examples of the organic polymer include "SiLK" (trade name; product of The Dow Chemical Co./USA, specific dielectric constant: 2.7, heat resistance temperature: 490° C. or greater, dielectric breakdown voltage: 4.0 to 5.0 MV/Vm) and polyallyl ether (PAE) materials such as "FLARE" (trade name; product of Honeywell Electronic Materials/USA, specific dielectric constant: 2.8, heat resistance temperature: 400° C. or greater). The PAE materials feature a high fundamental performance and excellent mechanical strength, heat stability and cost performance. Examples of the organic silica glass (SiOC material) include "HSG-R7" (trade name; product of Hitachi Chemical Co., Ltd., specific dielectric constant: 2.8, heat resistance temperature: 650° C.), "Black Diamond" (trade mark; product of Applied Materials, Inc./USA, specific dielectric constant: 3.0 to 2.4, heat resistance temperature: 450° C.) and "p-MTES" (trade name; product of Hitachi Kaihatsu, specific dielectric constant: 3.2). Additional examples of the SiOC materials include "CORAL" (trade name; product of Novellus System, Inc./USA, specific dielectric constant: 2.7 to 2.4, heat resistance temperature; 500° C.) and "Aurora 2.7" (trade name; product of Nippon ASM, specific dielectric constant: 2.7, heat resistance temperature: 450° C.).

As the low dielectric constant material for the insulating films 11a1,11b1,11c1,11d1, FSG (SiOF material), HSQ (hydrogen silsesquioxane) materials, MSQ (methyl silsesquioxane) materials, porous HSQ materials, porous MSQ materials and porous organic materials are also usable.

Examples of the HSQ material include "OCD T-12" (trade name; product of Tokyo Ohka Kogyo, specific dielectric constant: 3.4 to 2.9, heat resistance temperature: 450° C.), "Fox" (trade name; product of Dow Corning Corp/USA, specific dielectric constant: 2.9) and "OCL T-32" (trade name; product of Tokyo Ohka Kogyo, specific dielectric constant: 2.5, heat resistance temperature: 450° C.).

Examples of the MSQ material include "OCD T-9" (trade name; product of Tokyo Ohka Kogyo, specific dielectric constant: 2.7, heat resistance temperature: 600° C.), "LKD-T200" (trade name; product of JSR, specific dielectric constant: 2.7 to 2.5, heat resistance temperature: 450° C.), "HOSP" (trade name; product of Honeywell Electronic Materials/USA, specific dielectric constant: 2.5, heat resistance temperature: 550° C.), "HSG-RZ25" (trade name; product of Hitachi Chemical Co., Ltd., specific dielectric constant: 2.5, heat resistance temperature: 650° C.), "OCL T-31" (trade name; product of Tokyo Ohka Kogyo, specific dielectric constant: 2.3, heat resistance temperature: 500° C.) and "LKD-T400" (trade name; product of JSR, specific dielectric constant: 2.2 to 2, heat resistance temperature: 450° C.).

Examples of the porous HSQ material include "XLK" (trade name; product of Dow Corning Corp./USA, specific dielectric constant: 2.5 to 2), "OCL T-72" (trade name; product of Tokyo Ohka Kogyo, specific dielectric constant: 2.2 to 1.9, heat resistance temperature: 450° C.), "Nanoglass" (trade name; product of Honeywell Electronic Materials/USA, specific dielectric constant: 2.2 to 1.8, heat resistance temperature: 500° C. or greater) and "MesoELK" (trade name; product of Air Products and Chemicals, Inc./ USA, specific dielectric constant: 2 or less).

Examples of the porous MSQ material include "HSG-6211X" (trade name; product of Hitachi Chemical Co., Ltd., dielectric constant: 2.4, heat resistance temperature: 650° C.), "ALCAP-S" (trade name; product of Asahi Chemical Industry Co., Ltd., dielectric constant: 2.3 to 1.8, heat resistance temperature: 450° C.), "OCL T-77" (trade name; product of Tokyo Ohka Kogyo Co., Ltd., specific dielectric constant: 2.2 to 1.9, heat resistance temperature: 600° C.), "HSG-6210X" (trade name; product of Hitachi Chemical Co., Ltd., specific dielectric constant: 2.1, heat resistance temperature: 650° C.), and "silica aerogel" (trade name; product of Kobe Steel, Ltd., specific dielectric constant: 1.4–1.1).

Examples of the porous organic material include "Poly ELK" (trade name; product of Air Products and Chemicals, Inc/USA, specific dielectric constant: 2 or less, heat resistance temperature: 490° C.).

The SiOC materials and SiOF materials are formed, for example, by CVD (Chemical Vapor Deposition) or a coating method. "Black Diamond" is formed, for example, by CVD using a mixed gas of trimethylsilane and oxygen, while "p-MTES" is formed, for example, by CVD using a mixed gas of methyltriethoxysilane and $N_2O$. The other lowdielectric-constant insulating materials are formed, for example, by a coating method.

Insulating films 11a2,11b2,11c2,11d2 over the insulating films 11a1,11b1,11c1,11d1 made of a Low-K insulating film are so-called Low-K capping insulating films. These insulating films 11a2,11b2,11c2,11d2 are each made of a silicon oxide ($SiO_x$) film typified by silicon dioxide ($SiO_2$), and they serve, for example, to maintain the mechanical strength, protect the surface and maintain the humidity resistance of the insulating films 11a1,11b1,11c1,11d1 upon CMP treatment. The insulating films 11a2,11b2,11c2,11d2 are each thinner than the insulating films 11a1,11b1,11c1,11d1, and they are, for example, about 25 nm to 100 nm, preferably about 50 nm thick. These insulating films 11a2,11b2,11c2, 11d2 are not limited to a silicon oxide film, but can be changed. For example, a silicon nitride ($Si_xN_y$) film, silicon carbide (SiC) film or silicon carbonitride (SiCN) film is also usable. The silicon nitride film, silicon carbide film or silicon carbonitride film can be formed, for example, by plasma CVD. Examples of the silicon carbide film formed by plasma CVD include "BLOk" (trade mark; product of Applied Materials, Inc., specific dielectric constant: 4.3). Upon its formation, a mixed gas of trimethylsilane and helium (or $N_2$, $NH_3$) is used.

In these insulating films 11d,15c, a flat and strip-shaped interconnect trench (interconnect opening portion) 16b is formed as in Embodiment 1. In the insulating films 11d,15c, a flat and disc-shaped through-hole (interconnect opening portion) 19 is formed, extending from the bottom of the interconnect trench 16b toward the upper surface of the inlaid second-level interconnect L2. Also, in Embodiment 3, a conductive barrier film 17b is deposited over the insulating film 11d (insulating film 11d2) of the wafer 1W, and inside of the interconnect trench 16b and thorough-hole 19. The conductive barrier film 17b is adhered thinly inside (side surface and bottom surface) of the interconnect trench 16b and through-hole 19 without completely filling them. In this Embodiment 3, however, the conductive barrier film 17b has two conductor films 17b1,17b2 stacked one after another. More specifically, the conductive barrier film 17b has a bottom conductor layer 17b1 that is contiguous to the insulating films 11c,11d,15b,15c and a conductor film 17b2 stacked over the conductor film 17b1. The conductor films 17b1,17b2 are similar to those described with reference to Embodiment 1. Accordingly, effects similar to those available from the conductor films 17b1,17b2, as described in connection Embodiment 1, are available.

The present inventors have found, for the first time, that the formation of the conductive barrier film 17b only from the conductor film 17b2 made of titanium silicon nitride (TiSiN), without disposing the conductor film 17b1, deteriorates the quality of the Low-K insulating film upon plasma treatment of the conductor film 17b2. Upon formation of the TiSiN film, hydrogen ($H_2$)/nitrogen ($N_2$) plasma treatment is conducted in order to remove carbon (C) existing in the TiSiN film. This causes the above-described deterioration in the film quality, such as disappearance or peeling of the film caused by ashing of the Low-K film (particularly, an organic material such as SiLK) having carbon in the film. In this Embodiment 3, when the interconnect structure has a Low-K insulating film structure, the conductor film 17b1 is deposited prior to the deposition of the conductor film 17b2 made of titanium silicon nitride (TiSiN) to prevent direct contact of the conductor film 17b2 with the Low-K insulating films (insulating films 11c1, 11d1). This makes it possible to prevent a disappearance or peeling of the Low-K insulating films, which will otherwise occur owing to exposure of the conductor film 17b2 to plasma. The conductor film 17b1 that is brought into contact with the Low-K insulating films (insulating films 11c1,11d1) must be free of carbon in the film. Examples of such a film include tantalum, titanium, tantalum nitride, titanium nitride, a laminate film of tantalum and tantalum nitride and a laminate film of titanium and titanium nitride. Formation of the conductor film 17b1 by deposition by sputtering is preferred. Adhesion between the conductor film 17b1 and the Low-K insulating films (insulating films 11c1,11d1) can also be improved by adopting sputtering for the formation of the conductor film 17b1 between the conductor film 17b2 and Low-K insulating films, compared with the adoption of CVD or ALD.

Figure 23:
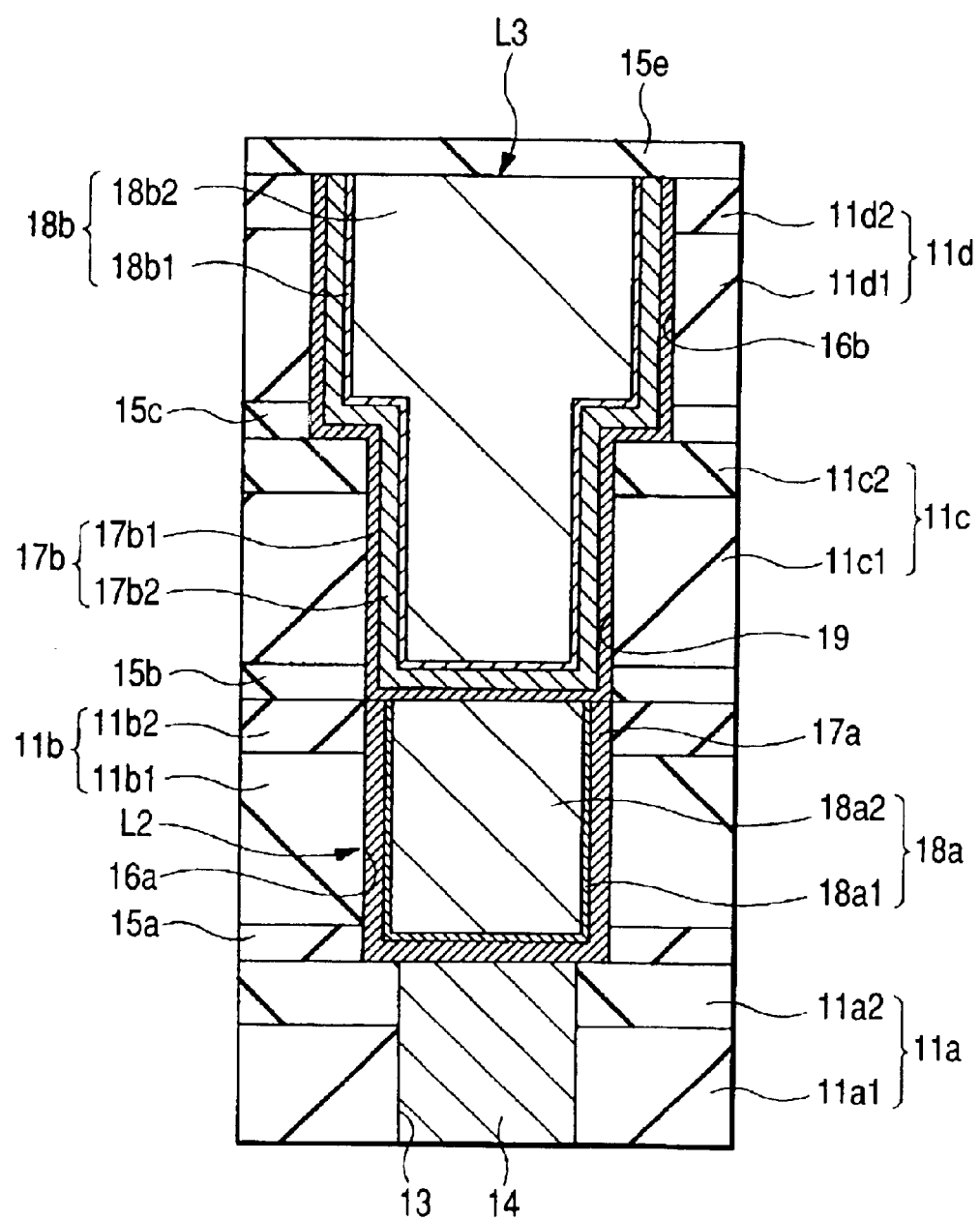
FIG. 23 is a fragmentary cross-sectional view of the interconnect formation portion of the semiconductor device, as seen in a manufacturing step following that of FIG. 22.
Figure 24:
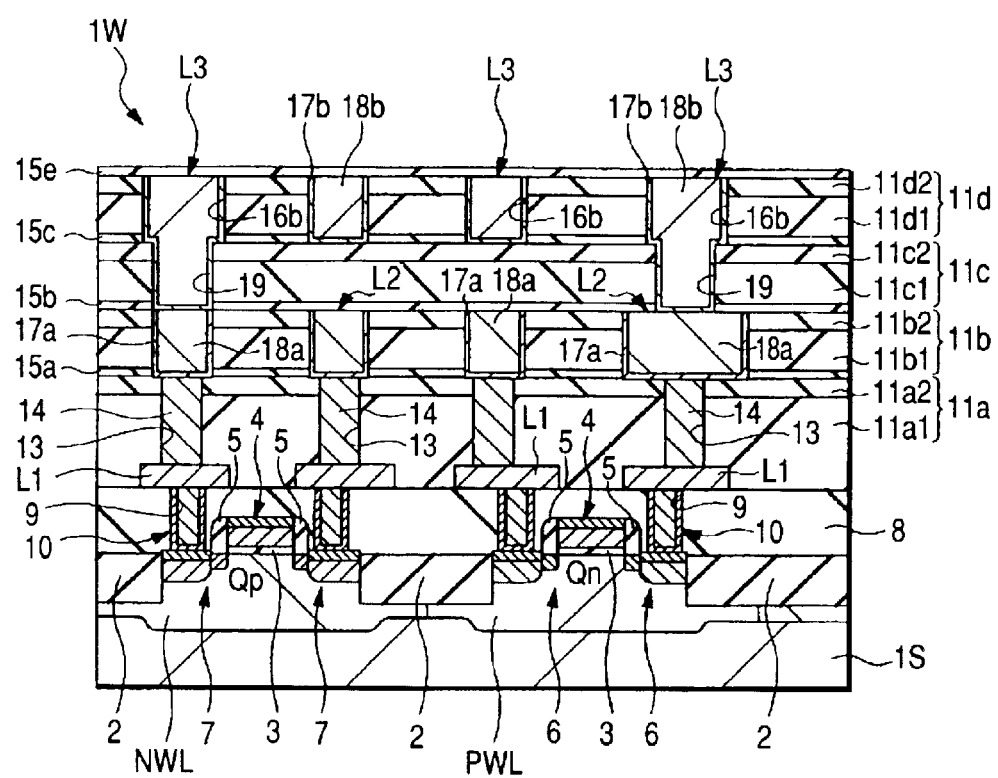
FIG. 24 is a fragmentary cross-sectional view of a wafer of the semiconductor device, as seen in the manufacturing step of FIG. 23.

FIG. 23 is a fragmentary cross-sectional view of the interconnect formation portion of the semiconductor device, as seen in a manufacturing step following that of FIG. 22; and FIG. 24 is a fragmentary cross-sectional view of the wafer as seen during the manufacturing step of FIG. 23. As in Embodiment 1, a main conductor film 18b, composed mainly of copper, is deposited over the conductive barrier film 17b over the main surface of the wafer 1W, followed by polishing the unnecessary portions of the conductive barrier film 17b and main conductor film 18b by CMP, whereby an inlaid third-level interconnect L3 is formed in the interconnect trench 16 and through-hole 19. As in Embodiment 1, after various post-CMP treatments, an interconnect-capping insulating film 15e is deposited over the insulating film 11d over the main surface of the wafer 1W and the inlaid third-level interconnect L3. In the above-described manner, a semiconductor device having a Low-K insulating film structure according to Embodiment 3 is fabricated. Embodiment 3 is directed to a structure having Low-K cap insulating films 11a2,11b2,11c2,11d2. Adoption of the above-described abrasive-free chemical mechanical polishing upon CMP treatment makes the polished surface of the insulating films 11a to 11d scratch-free, so that the structure can be formed without the Low-K capping insulating films 11a2, 11b2,11c2,11d2. This brings about a drastic reduction in the dielectric constant of the insulating film in the interconnect layer and a drastic reduction in the interconnect capacitance, leading to an improvement in the operation speed of the resulting semiconductor device.

The invention made by the present inventors has been described specifically based on some embodiments. However, it should be borne in mind that the present invention is not limited to or by such examples. It is needless to say that the invention can be modified within an extent not departing from the gist of the invention.

For example, as the inlaid third-level interconnect of Embodiment 3, the inlaid third-level interconnect of Embodiment 1 is also usable. Since the inlaid third-level interconnect of Embodiment 1 has a conductive barrier film structure in which another condition film is disposed below a conductor film, such as titanium silicon nitride, problems which will otherwise occur in the Low-K insulating film structure, as described in connection with Embodiment 3, can be avoided.

In connection with the above-described Embodiments 1 to 3, a description was made of application of the interconnect structure of this Embodiment to the inlaid third-level interconnect. However, it can be applied not only to the inlaid third-level interconnect, but also to an interconnect thereunder or thereover, such as the first-level or second-level interconnect, or four-level or fifth-level interconnect.

According to the description so far, the invention made by the present inventors was applied to a semiconductor device having a CMIS circuit, which is an industrial field involving the background of the invention, but the invention can be applied not only to the above-described example, but also to semiconductor devices having a memory circuit, such as a DRAM (Dynamic Random Access Memory), SRAM (Static Random Access Memory) and flash memory (EEPROM; Electric Erasable Programmable Read Only Memory), semiconductor devices having a logic circuit, such as a microprocessor, and hybrid type semiconductor devices having both the memory circuit and logic circuit mounted on the same semiconductor substrate. It is also applicable to electronic devices or a micromachine having an inlaid copper interconnect structure.

Typical advantages available by the embodiments of the present application will be described briefly.

Formation, between a conductor film formed in an interconnect opening portion and composed mainly of copper and another conductor film formed by chemical vapor deposition and having a copper-diffusion barrier property, of a further conductor film composed of a material having good adhesion with copper makes it possible to improve the adhesion between the conductor film constituting the interconnect of the semiconductor device and composed mainly of copper and the other conductor film formed by chemical vapor deposition and having a copper-diffusion barrier property. This leads to an improvement in the reliability of the semiconductor device having, as an interconnect material, a conductor film composed mainly of copper; an improvement in the step coverage in the interconnect structure having, as a main conductor film, a conductor film composed mainly of copper; an improvement in the EM resistance of the interconnect structure; and a reduction in the interconnect resistance.

Of the aspects of the invention disclosed by the present application, a typical advantage will be described.

Adhesion between a conductor film composed mainly of copper and another conductor film having a copper-diffusion barrier property, each constituting the interconnect of a semiconductor device, can be improved.

What is claimed is:

1. A semiconductor device comprising:
   (a) a first insulating film deposited over a semiconductor substrate;
   (b) an interconnect opening portion formed in the first insulating film;
   (c) an interconnect disposed in the interconnect opening portion; and
   (d) a second insulating film formed over the first insulating film and the interconnect,
   said interconnect having:
   a first conductor film formed in the interconnect opening portion;
   a second conductor film formed in the interconnect opening portion via the first conductor film by chemical vapor deposition or ALD and comprised of any one of titanium silicon nitride, tantalum silicon nitride, tantalum nitride and titanium nitride;
   a third conductor film formed in the interconnect opening portion via the first and second conductor films and comprised of a material having good adhesion with copper; and
   a fourth conductor film formed in the interconnect opening portion via the first, second and third conductor films and having copper as a main component.

2. A semiconductor device comprising:
   (a) a first insulating film deposited over a semiconductor substrate and having a lower dielectric constant than that of silicon oxide;
   (b) an interconnect opening portion formed in the first insulating film;
   (c) an interconnect disposed in the interconnect opening portion; and
   (d) a second insulating film formed over the first insulating film and the interconnect,
   said interconnect having:
   a first conductor film formed in the interconnect opening portion;
   a second conductor film formed in the interconnect opening portion via the first conductor film by chemical vapor deposition or ALD and comprised of any one of titanium silicon nitride, tantalum silicon nitride, tantalum nitride and titanium nitride; and
   a fourth conductor film formed in the interconnect opening portion via the first and second conductor films and having copper as a main component.

3. A semiconductor device according to claim 1, wherein the third conductor film has a copper-diffusion barrier property.

4. A semiconductor device according to claim 1, wherein the third conductor film is comprised of any one of tantalum, titanium, tantalum nitride, titanium nitride, laminate film of tantalum and tantalum nitride and laminate film of titanium and titanium nitride.

5. A semiconductor device according to claim 1, wherein the first conductor film is comprised of a material having good adhesion with the first insulating film.

6. A semiconductor device according to claim 1, wherein the third conductor film is comprised of a material having good adhesion with copper.

7. A semiconductor device according to claim 1, wherein the second conductor film has a copper-diffusion barrier property.

8. A semiconductor device according to claim 1, wherein the first conductor film is comprised of any one of tantalum, titanium, tantalum nitride, titanium nitride, laminate film of tantalum and tantalum nitride and laminate film of titanium and titanium nitride.

9. A semiconductor device according to claim 1, wherein the first insulating film has a lower dielectric constant than that of silicon oxide.

10. A semiconductor device comprising:
    (a) a first insulating film deposited over a semiconductor substrate;
    (b) an interconnect opening portion formed in the first insulating film;
    (c) an interconnect disposed in the interconnect opening portion; and
    (d) a second insulating film formed over the first insulating film and the interconnect,
    said interconnect having:
    a second conductor film formed in the interconnect opening portion by chemical vapor deposition or ALD and comprised of any one of titanium silicon nitride, tantalum silicon nitride, tantalum nitride and titanium nitride;
    a third conductor film formed in the interconnect opening portion via the second conductor films and comprised of a material having good adhesion with copper; and
    a fourth conductor film formed in the interconnect opening portion via the second and third conductor films and having copper as a main component.

11. A semiconductor device according to claim 10, wherein the third conductor film has a copper-diffusion barrier property.

12. A semiconductor device according to claim 10, wherein the third conductor film is comprised of any one of tantalum, titanium, tantalum nitride, titanium nitride, laminate film of tantalum and tantalum nitride and laminate film of titanium and titanium nitride.

13. A semiconductor device according to claim 1, wherein the interconnect is formed to have a damascene structure.

14. A semiconductor device having a first-level interconnect over a semiconductor substrate, the first-level interconnect comprising:

a main conductor film composed of copper or composed mainly of copper;

a first conductor film formed over the side surfaces and bottom surface of the main conductor film; and a second conductor film formed over the side surfaces and bottom surface of the main conductor film via the first conductor film, wherein the first conductor film has higher adhesion with the main conductor film than the second conductor film has, and wherein the second conductor film has a higher copper-diffusion barrier property than the first conductor film has.

15. A semiconductor device according to claim 14, wherein the second conductor film is formed by chemical vapor deposition or ALD, while the first conductor film is formed by sputtering.

16. A semiconductor device according to claim 13, wherein the thickness of the first conductor film formed over the side surfaces of the main conductor film is greater than that formed on the bottom surface of the main conductor film.

17. A semiconductor device according to claim 14, further comprising a third conductor film formed over the side surfaces and bottom surface of the main conductor film via the first conductor film and the second conductor film, wherein the third conductor film has higher adhesion with the main conductor film than the second conductor film has.

18. A semiconductor device according to claim 14, wherein the number of elements constituting the second conductor film is greater than that constituting the first conductor film.

19. A semiconductor device according to claim 14, wherein the second conductor film is comprised of any one of titanium silicon nitride, tantalum silicon nitride, tantalum nitride and titanium nitride, and wherein the first conductor film is comprised of any one of tantalum, titanium, tantalum nitride, titanium nitride, laminate film of tantalum and tantalum nitride, and laminate film of titanium and titanium nitride.

20. A semiconductor device according to claim 2, wherein the first conductor film has higher adhesion with the main conductor film than the second conductor film has, and wherein the second conductor film has a higher copper-diffusion barrier property than the first conductor film has.

21. A semiconductor device according to claim 2, wherein the first conductor film is formed by sputtering.

* * * * *